(12) United States Patent
Tomantschger et al.

(10) Patent No.: US 8,906,515 B2
(45) Date of Patent: *Dec. 9, 2014

(54) METAL-CLAD POLYMER ARTICLE

(75) Inventors: Klaus Tomantschger, Mississauga (CA); Jonathan McCrea, Toronto (CA); Nandakumar Nagarajan, Burlington (CA); Francisco Gonzalez, Toronto (CA); Gino Palumbo, Toronto (CA); Konstantinos Panagiotopoulos, Etobicoke (CA); Herath Katugaha, Toronto (CA); Diana Facchini, Toronto (CA); Jared J. Victor, Toronto (CA); Uwe Erb, Toronto (CA)

(73) Assignee: Integran Technologies, Inc., Mississauga (CA)

( * ) Notice: Subject to any disclaimer, the term of this patent is extended or adjusted under 35 U.S.C. 154(b) by 890 days.

This patent is subject to a terminal disclaimer.

(21) Appl. No.: 12/785,524

(22) Filed: May 24, 2010

(65) Prior Publication Data
US 2010/0304065 A1  Dec. 2, 2010

Related U.S. Application Data

(63) Continuation-in-part of application No. 12/476,455, filed on Jun. 2, 2009, now Pat. No. 8,394,507.

(51) Int. Cl.
| | |
|---|---|
| *B32B 1/08* | (2006.01) |
| *B32B 3/30* | (2006.01) |
| *B32B 15/08* | (2006.01) |
| *C25D 5/56* | (2006.01) |
| *B05D 3/00* | (2006.01) |
| *C23C 16/02* | (2006.01) |
| *C25D 5/54* | (2006.01) |
| *C23C 14/02* | (2006.01) |
| *C23C 18/18* | (2006.01) |

(52) U.S. Cl.
CPC ........... *C23C 14/021* (2013.01); *C23C 16/0272* (2013.01); *C23C 16/0227* (2013.01); *C25D 5/54* (2013.01); *C23C 14/024* (2013.01); *B32B 15/08* (2013.01); *C23C 14/028* (2013.01); *C23C 16/0254* (2013.01); *C23C 18/1851* (2013.01)
USPC .......... 428/626; 428/680; 428/332; 428/35.8; 428/609; 428/612; 205/164; 427/250; 427/322

(58) Field of Classification Search
USPC ............... 428/626, 680, 612, 34.1, 35.7, 216, 428/215, 213, 214, 332, 334, 335, 336, 428/35.8, 35.9, 624, 609, 679
See application file for complete search history.

(56) References Cited

U.S. PATENT DOCUMENTS

| | | | |
|---|---|---|---|
| 3,625,758 | A | 12/1971 | Stahl et al. |
| 3,652,351 | A | 3/1972 | Guisti |

(Continued)

FOREIGN PATENT DOCUMENTS

| | | |
|---|---|---|
| DE | 10228323 A1 | 1/2004 |
| EP | 1 339 270 A2 | 8/2003 |

(Continued)

OTHER PUBLICATIONS

U.S. Appl. No. 12/785,650, filed May 24, 2010, Victor et al.

(Continued)

*Primary Examiner* — Michael E La Villa
(74) *Attorney, Agent, or Firm* — Bacon & Thomas, PLLC

(57) ABSTRACT

Metal-clad polymer articles containing structural fine-grained and/or amorphous metallic coatings/layers optionally containing solid particulates dispersed therein, are disclosed. The fine-grained and/or amorphous metallic coatings are particularly suited for strong and lightweight articles, precision molds, sporting goods, automotive parts and components exposed to thermal cycling although the coefficient of linear thermal expansion (CLTE) of the metallic layer and the substrate are mismatched. The interface between the metallic layer and the polymer is suitably pretreated to withstand thermal cycling without failure.

26 Claims, 1 Drawing Sheet

(56) References Cited

U.S. PATENT DOCUMENTS

| | | |
|---|---|---|
| 3,671,411 A | 6/1972 | Ray et al. |
| 4,054,693 A | 10/1977 | Leech |
| 4,234,398 A | 11/1980 | Yamamoto |
| 4,425,380 A | 1/1984 | Nuzzi et al. |
| 4,552,626 A | 11/1985 | Stevenson |
| 4,592,852 A | 6/1986 | Courduvelis et al. |
| 4,601,784 A | 7/1986 | Krulik |
| 4,704,196 A | 11/1987 | Saito et al. |
| 4,839,006 A | 6/1989 | Nakao et al. |
| 4,859,300 A | 8/1989 | Sullivan et al. |
| 5,062,930 A | 11/1991 | Dillon et al. |
| 5,185,185 A | 2/1993 | Nishizawa |
| 5,203,973 A | 4/1993 | Reith et al. |
| 5,229,167 A | 7/1993 | Tsukamoto |
| 5,352,266 A | 10/1994 | Erb |
| 5,382,505 A | 1/1995 | Schmidt et al. |
| 5,433,797 A | 7/1995 | Erb |
| 5,648,125 A | 7/1997 | Cane |
| 5,863,410 A | 1/1999 | Yates |
| 6,099,939 A | 8/2000 | Mittal et al. |
| 6,996,425 B2 | 2/2006 | Watanabe |
| 7,320,832 B2 | 1/2008 | Palumbo |
| 7,354,354 B2 | 4/2008 | Palumbo |
| 8,394,507 B2 * | 3/2013 | Tomantschger et al. ...... 428/626 |
| 2005/0199587 A1 | 9/2005 | Bengston |
| 2005/0205425 A1 | 9/2005 | Palumbo |
| 2006/0135281 A1 | 6/2006 | Palumbo et al. |
| 2006/0135282 A1 | 6/2006 | Palumbo et al. |
| 2007/0281176 A1 | 12/2007 | Palumbo et al. |
| 2008/0254310 A1 * | 10/2008 | Palumbo et al. ............. 428/551 |
| 2009/0159451 A1 | 6/2009 | Tomantschger |
| 2010/0304065 A1 | 12/2010 | Tomantschger et al. |

FOREIGN PATENT DOCUMENTS

| | | |
|---|---|---|
| WO | WO 2009/045431 A1 | 4/2009 |
| WO | WO 2009/073435 A1 | 6/2009 |
| WO | WO 2009/076777 A1 | 6/2009 |

OTHER PUBLICATIONS

U.S. Appl. No. 12/785,662, filed May 25, 2010, Victor et al.
U.S. Appl. No. 12/476,506, McCrea.

* cited by examiner

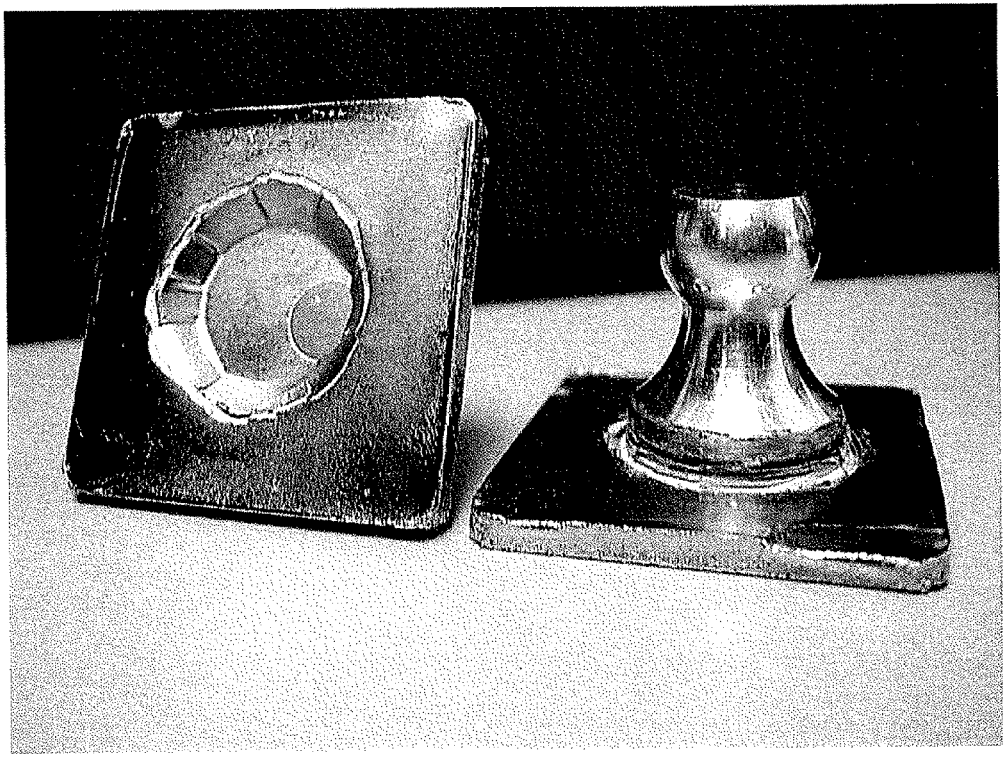

METAL-CLAD POLYMER ARTICLE

CROSS REFERENCE TO RELATED APPLICATION

This application is a continuation in part of application Ser. No. 12/476,455, filed on Jun. 2, 2009, now U.S. Pat. No. 8,394,507, granted Mar. 12, 2013.

FIELD OF THE INVENTION

This invention relates to metal-clad polymer articles comprising polymeric materials having a coefficient of linear thermal expansion exceeding $25 \times 10^{-6}$ $K^{-1}$ in at least one direction and fine-grained (average grain-size: 2-5,000 nm) or amorphous metallic materials having a coefficient of thermal expansion below $25 \times 10^{-6}$ $K^{-1}$ enabled by the enhancement of the pull-off strength between the metallic material and the polymer. The metal-clad polymer articles with mismatched coefficients of thermal expansion display good adhesion between the metallic layers and the polymeric materials as well as excellent thermal cycling performance and are suitable for structural applications.

BACKGROUND OF THE INVENTION

The invention relates to metal-clad polymer articles comprising amorphous or fine-grained metallic coatings/layers on polymeric-composite materials/substrates with good adhesion and thermal cycling performance for use in structural applications.

Due to their low cost and ease of processing/shaping by various means, polymeric materials, which are optionally filled with, or reinforced with, materials selected from the group of metals, metal alloys, and/or carbon based materials selected from the group of graphite, graphite fibers, carbon, carbon fibers and carbon nanotubes, glass, glass fibers and other inorganic fillers, are widely used.

Applying metallic coatings or layers to the surfaces of polymer parts or vice versa is of considerable commercial importance because of the desirable properties obtained by combining polymers and metals. Metallic materials, layers and/or coatings are strong, hard, tough and aesthetic and can be applied to polymer substrates by various low temperature commercial process methods including electroless deposition techniques and/or electrodeposition. The metal deposits must adhere well to the underlying polymer substrate even in corrosive environments and when subjected to thermal cycling and loads, as encountered in outdoor or industrial service.

The prior art describes numerous processes for metalizing polymers to render them suitable for metal deposition by conditioning the substrate's surface to ensure metal deposits adequately bond thereto resulting in durable and adherent metal coatings. The most popular substrate conditioning/activation process is chemical etching.

Stevenson in U.S. Pat. No. 4,552,626 (1985) describes a process for metal plating filled thermoplastic resins such as Nylon-6®. The filled resin surface to be plated is cleaned and rendered hydrophilic and preferably deglazed by a suitable solvent or acid. At least a portion of the filler in the surface is removed, preferably by a suitable acid. Thereafter electroless plating is applied to provide an electrically conductive metal deposit followed by applying at least one metallic layer by electroplating to provide a desired wear resistant and/or decorative metallic surface. Stevensen provides no information on thermal cycling performance or adhesion strength.

Leech in U.S. Pat. No. 4,054,693 (1977) discloses processes for the activation of resinous materials with a composition comprising water, permanganate ion and manganate ion at a pH in the range of 11 to 13 exhibiting superior peel strengths following electroless metal deposition. Leech provides no information on thermal cycling performance, and adhesion strength is exclusively measured using a peel test.

Nishizawa in U.S. Pat. No. 5,185,185 (1993) discloses methods for pretreating polymeric resin molded articles molded from various resins and a glass-reinforcing agent such as glass fibers by (i) treating the resin molded article by immersion in an oxidative acid solution, (ii) treating the resulting resin molded article by immersion in an organic polar solvent-containing liquid, and (iii) treating the resulting resin molded article by immersion in a solvent which can dissolve one or both of the glass reinforcing agent and one or more of the other thermoplastic resins. The use of ammonium fluoride as glass fiber etchant is shown to enhance adhesion. Nishizawa provides no information on thermal cycling performance and reports peel strength data ≤1.5 kg/cm (≤14.7 N/cm).

Yates in U.S. Pat. No. 5,863,410 (1999) describes an electrolytic process for producing copper foil having a matte surface with micropeaks with a height not greater than about 200 microinches (~5 micron) exhibiting a high peel strength when bonded to a polymeric substrate.

Various patents address the fabrication of articles for a variety of applications:

Watanabe in U.S. Pat. No. 6,996,425 (2006) describes a cellular telephone housing formed from a polymeric material by molding, wherein the base is coated with a metal multi layer to about 10 micron thickness, including a lower metal layer (adjacent to the polymer substrate) made of a ductile metal such as Cu and an upper metal layer made of a less ductile metal such as Ni to achieve high strength, rigidity and shock resistance. The ductile metal layer is 4-5 times thicker than the upper metal layer. Watanabe provides no information on thermal cycling performance or adhesion strength.

Erb in U.S. Pat. No. 5,352,266 (1994), and U.S. Pat. No. 5,433,797 (1995), assigned to the same applicant, describe a process for producing nanocrystalline materials, particularly nanocrystalline nickel based materials. The nanocrystalline material is electrodeposited onto the cathode in an aqueous electrolyte by the application of a pulsed current.

Palumbo in US 2005/0205425 A1 (2002) and DE 10,228,323 (2005), assigned to the same applicant, discloses a process for forming coatings or freestanding deposits of nanocrystalline metals, metal alloys or metal matrix composites. The process employs tank plating, drum plating or selective plating processes using aqueous electrolytes and optionally a non-stationary anode or cathode. Nanocrystalline metal matrix composites are disclosed as well.

Tomantschger in US 2009/0159451 A1, assigned to the same applicant, discloses variable property deposits of fine-grained and amorphous metallic materials, optionally containing solid particulates.

Palumbo in U.S. Pat. No. 7,320,832 (2008), assigned to the same applicant, discloses means for matching the coefficient of thermal expansion (CTE) of fine-grained metallic coating to the one of the substrate by adjusting the composition of the alloy and/or by varying the chemistry and volume fraction of particulates embedded in the coating. The fine-grained metallic coatings are particularly suited for strong and lightweight articles, precision molds, sporting goods, automotive parts and components exposed to thermal cycling and include selected polymeric substrates. Maintaining low CTEs (<25×$10^{-6}$ $K^{-1}$) and matching the CTEs of the fine-grained metallic coating with the CTEs of the substrate minimizes dimensional changes during thermal cycling and preventing delamination. Palumbo provides no information on the adhesion strength.

Palumbo in U.S. Pat. No. 7,354,354 (2008), assigned to the same applicant, discloses lightweight articles comprising a polymeric material at least partially coated with a fine-grained metallic material. The fine-grained metallic material has an average grain size of 2 nm to 5,000 nm, a thickness between 25 micron and 5 cm, and a hardness between 200 VHN and 3,000 VHN. The lightweight articles are strong and ductile and exhibit high coefficients of restitution and a high stiffness and are particularly suitable for a variety of applications including aerospace and automotive parts, sporting goods, and the like. Palumbo provides no information on thermal cycling performance or adhesion strength. To enhance the adhesion of the metallic coating the surface to be coated is roughened by any number of suitable means including, e.g., mechanical abrasion, plasma and chemical etching.

Andri in WO 2009/045431 describes portable electronic devices comprising a structural synthetic resin and structural coatings of fine-grained metallic materials for added strength, rigidity and impact resistance. According to Andri the metal adheres well to the synthetic resin without any special treatment; however, a method for improving adhesion can be used including abrasion, addition of adhesion promotion agents, chemical etching, functionalization of the surface by exposure to plasma and/or radiation or any combination of these. Andri provides no information on thermal cycling performance or adhesion strength.

Andri in WO 2009/073435 describes automotive parts with a composition comprising partially aromatic polyamide (PAP), aliphatic polyamide and/or polymeric toughener and alkaline earth metal carbonate e.g. calcium carbonate. The polymer is activated using mechanical and/or chemical etching, specifically acidic materials such as sulfochromic acid, hydrochloric acid or sulfuric acid.

SUMMARY OF THE INVENTION

It is an objective of the present invention to provide strong, lightweight metal-clad polymer articles for use in structural applications, e.g., in automotive, aerospace and defense applications, industrial components, electronic equipment or appliances and sporting goods, molding applications and medical applications, having a metallic layer applied to a polymeric substrate with enhanced adhesion, pull-off strength, peel strength, shear strength and thermal cycling performance.

It is an objective of the invention to provide a metallic coating/layer selected from the group of amorphous, fine-grained (defined as an average grain size between 2 and 5,000 nm) and coarse-grained metal (defined as an average grain size >5 microns), metal alloy or metal matrix composites. The metallic coating/layer is applied to the polymer substrate by a suitable metal deposition process. Preferred metal deposition processes include low temperature processes, i.e., processes operating below the softening and/or melting temperature of the polymer substrates, selected from the group of electroless deposition, electrodeposition, physical vapor deposition (PVD), chemical vapor deposition (CVD) and gas condensation. Alternatively, the polymer can be applied to a metallic layer. The metallic material represents between 1 and 95% of the total weight of the article.

It is an objective of the present invention to provide single or multiple structural metallic layers having a microstructure selected from the group of fine-grained, amorphous, graded and layered structures, which have a total thickness in the range of between 2.5 micron and 5 cm, preferably between 25 micron and 2.5 cm and more preferably between 50 micron and 500 micron.

It is an objective of this invention to provide articles comprising fine-grained and/or amorphous metallic coatings which are, at least in part, graded and/or layered, i.e., "variable property metallic coatings".

In addition to providing improved mechanical properties it is an objective of the invention to apply a metallic layer or metallic layers to provide further functional properties to the metal-clad polymer article including thermal conductivity and heat-dissipation, magnetic properties including, but not limited to, electromagnetic interference (EMI) shielding and radio-frequency interference (RFI) shielding, antimicrobial properties, superhydrophobicity and self cleaning properties.

Furthermore it is an objective to optionally apply topcoats to the metallic layers or exposed polymeric substrate with decorative coatings such as chromium plate or paint.

It is an objective of the invention to provide a metal-clad polymer article comprising a shaped or molded polymer component comprising polymeric resins or polymeric composites including, but not limited to, epoxies, ABS, polypropylene, polyethylene, polystyrene, vinyls, acrylics, polyamide and polycarbonates. Suitable fillers include carbon, ceramics, oxides, carbides, nitrides, polyethylene, fiberglass and glass in suitable forms including fibers and powders. The polymeric substrate has a room temperature coefficient of linear thermal expansion (CLTE) in at least one direction of between $30 \times 10^{-6}$ $K^{-1}$ and $500 \times 10^{-6}$ $K^{-1}$, e.g., of between $30 \times 10^{-6}$ $K^{-1}$ and $250 \times 10^{-6}$ $K^{-1}$ It is an objective of this invention to provide a fine-grained and/or amorphous metallic layer having a room temperature CLTE in all directions of less than $25 \times 10^{-6}$ $K^{-1}$, for example, in the range between $-5.0 \times 10^{-6}$ $K^{-1}$ and $25 \times 10^{-6}$ $K^{-1}$. The metallic layer comprises one or more elements selected from the group of Ag, Al, Au, Co, Cr, Cu, Fe, Ni, Mo, Pb, Pd, Pt, Rh, Ru, Sn, Ti, W, Zn and Zr. Metal matrix composites consist of fine-grained and/or amorphous pure metals or alloys with suitable particulate additives. The latter additives include powders, fibers, nanotubes, flakes, metal powders, metal alloy powders and metal oxide powders of Al, Co, Cu, In, Mg, Ni, Si, Sn, V, and Zn; nitrides of Al, B and Si; C (graphite, diamond, nanotubes, Buckminster Fullerenes); carbides of B, Cr, Bi, Si, W; and self lubricating materials such as $MoS_2$ or organic materials e.g. PTFE. The fine-grained and/or amorphous metallic material has a high yield strength (300 MPa to 2,750 MPa) and ductility (1-15%).

It is an objective of the invention to utilize the enhanced mechanical strength and wear properties of fine-grained metallic coatings/layers with an average grain size between 1 and 5,000 nm, e.g., between 2 and 500 nm, and/or amorphous coatings/layers and/or metal matrix composite coatings exhibiting a coefficient of linear thermal expansion (CLTE) in the range of $-5 \times 10^{-6}$ $K^{-1}$ to $25 \times 10^{-6}$ $K^{-1}$ at room temperature in all directions. Metal matrix composites (MMCs) in this context are defined as particulate matter embedded in a fine-grained and/or amorphous metal matrix. MMCs can be produced e.g. in the case of using an electroless plating or electroplating process by suspending particles in a suitable plating bath and incorporating particulate matter into the deposit by inclusion or, e.g., in the case of cold spraying, by adding non-deformable particulates to the powder feed.

It is another objective of the invention to provide laminate articles, e.g., a metal-clad polymer article, comprising (i) a polymeric material which at room temperature has a coefficient of linear thermal expansion in the range between $30\times10^{-6}$ K$^{-1}$ and $250\times10^{-6}$ K$^{-1}$ in at least one direction and (ii) a metallic material having a microstructure which is fine-grained with an average grain size between 2 and 5,000 nm and/or an amorphous microstructure; the metallic material being in the form of a metallic layer having a thickness between 10 microns and 2.5 cm and a coefficient of linear thermal expansion in all directions in the range between $-5.0\times10^{-6}$ K$^{-1}$ and $25\times10^{-6}$ K$^{-1}$; the coefficient of linear thermal expansion in all directions of (ii) being at least 20% less than the coefficient of linear thermal expansion in at least one direction of (i); the laminate article and metal-clad polymer article exhibiting no delamination and the displacement of said metallic material relative to the polymeric material or relative to any intermediate layer being less than 2% after said articles has been exposed to at least one temperature cycle according to ASTM B553-71 service condition 1, 2, 3 or 4 and exhibiting a pull-off strength between the polymeric material and the metallic material or between any intermediate layer(s) and the metallic material exceeding 200 psi as determined by ASTM D4541-02 method A-E.

It is another objective of the invention to pretreat the surface of polymeric and/or the metallic material to achieve excellent adhesion between metallic layer and the polymer material is required to pass the thermal cycling tests specified without failure such as delamination.

It is an objective of the invention to suitably roughen or texture at least one of the surfaces to be mated to form specific surface morphologies, termed "anchoring structures" or "anchoring sites". The elimination of smooth surfaces provides for additional surface area for adhesion, increases the bond strength and reduces the risk of delamination and/or blistering.

It is an objective of the invention to provide a polymer-metal interface by creating suitable anchoring structures prior to applying the metal to the polymer or vice versa. The population of anchoring sites such as recesses/protrusions and the like enhances the physical bond between the polymer and the metal. It is an objective to create anchoring structures at the interface between the polymer and the metal exceeding 10 per cm, preferably exceeding 100 per cm and more preferably exceeding 1,000 per cm and up to 100,000 per cm, preferably up to 1,000,000 per cm and more preferably up to 10,000,000 per cm. Suitable anchoring structures have an average depth and average diameter/width in the range of between 0.01 and 5,000 micron, preferably in the range of between 0.05 and 500 micron. The shape of the anchoring structures preferably is irregular/random providing for a "locked in" bond between the two surfaces to be mated, e.g., as generated by metal deposition into a "polymer cavity" formed like and ink bottle, i.e., a narrow neck on the surface leading to a wide base in the bulk polymer. The overall strength of the metal-clad polymer article is governed by the bond strength between the polymer substrate and the immediately adjacent metallic layer.

It is another objective of the invention to provide laminate articles for components exposed to temperature cycling during use thereby increasing the need for acceptable CLTE mismatch between polymer and the metallic materials.

It is an objective of the invention to provide a polymeric or metallic substrate with an interface layer having a surface roughness Ra in the range of between 0.01 μm and 500 μm and/or Ry (Ry$_{max}$ according to DIN) in the range of 0.01 μm and 5,000 μm. In the context of this application the average surface roughness Ra is defined as the arithmetic means of the absolute values of the profile deviations from the mean line and Ry (Ry$_{max}$ according to DIN) is defined as the distance between the highest peak and the lowest valley of the interface surface.

It is an objective of the invention to apply a fine-grained and/or amorphous metallic coating to at least a portion of the surface of a part made substantially of polymer(s) and/or glass fiber composites and/or carbon/graphite fiber composites including carbon fiber/epoxy composites, optionally after metalizing the surface (layer thickness ≤5 micron, preferably ≤1 micron) with a thin layer of nickel, copper, silver or the like for the purpose of enhancing the electrical conductivity of the substrate surface. The fine-grained and/or amorphous coating is always substantially thicker (≥10 micron) than the metalizing layer. Any metalizing intermediate layer has a coefficient of linear thermal expansion (CLTE) in the range of $-5\times10^{-6}$ K$^{-1}$ to $25\times10^{-6}$ K$^{-1}$ at room temperature in all directions.

According to this invention patches or sleeves which are not necessarily uniform in thickness can be employed in order to, e.g., enable a metallic thicker coating on selected sections or areas of articles particularly prone to heavy use such as in the case of selected aerospace and automotive components, sporting goods, consumer products, electronic devices and the like.

It is an objective of the invention to achieve adhesion strength as measured using ASTM D4541-02 Method A-E "Standard Test Method for Pull-Off Strength of Coatings Using Portable Adhesion Testers" between the metallic material/coating and the polymer material/substrate which exceeds 200 psi, preferably 300 psi, preferably 500 psi and more preferably 600 psi and up to 6,000 psi.

It is an objective of the invention to suitably precondition the polymer substrate surface to enhance the adhesion between the polymer substrate and the metallic layer and achieve a strong interfacial bond between the polymer and the metal.

It is an objective of the invention to improve the adhesion between the polymeric substrate and the metallic layer by a suitable heat treatment of the metal-clad article for between 5 minutes and 50 hours at between 50 and 200° C.

It is an objective of this invention to provide articles composed of fine-grained and/or amorphous metallic coatings on composite polymeric substrates capable of withstanding 1, preferably 5, more preferably 10, more preferably 20 and even more preferably 30 temperature cycles without failure according to ANSI/ASTM specification B604-75 section 5.4 (Standard Recommended Practice for Thermal Cycling Test for Evaluation of Electroplated Plastics ASTM B553-71) for service condition 1, preferably service condition 2, preferably service condition 3 and even more preferably for service condition 4.

It is a further objective of the invention to render the metallic coatings super-hydrophobic and self-cleaning by applying a thin coat of a poorly wetting or non wetting material to the outer surface including, but not limited to, paint.

It is a further objective of the invention to render the metallic coatings hydrophobic, preferably super-hydrophobic and self cleaning by rendering the metallic coating poorly wetting or non wetting ("flat sheet contact angle" for deionized water of ≥85° including, but not limited to, applying metal matrix composite (MMC) outer layers containing non-wetting particulate additions.

It is a further objective of the invention to imprint anchoring structures on the polymer surface not be covered by the metallic coating to achieve a hydrophobic surface, i.e., raise the contact angle for water by ≥10°, preferably by ≥20°, more preferably by ≥25°, and even more preferably by ≥30° when compared to the contact angle measured on the flat polymer surface.

It is a further objective of the invention to imprint anchoring structures on portions of the polymer surface not be covered by the metallic coating to raise the contact angle for water of said polymeric surface to $\geq 100°$, preferably over $\geq 110°$ and more preferably $\geq 120°$ and render the polymeric surface self cleaning.

It is an objective of the invention to retain at least part of the polymer surface structures in the outer surface of the metallic coating by avoiding leveling/filling of the recesses to obtain a satin metal finish, defined as a surface roughness of Ra$\geq 0.5$ micron.

It is an objective of the invention to provide lightweight polymer/metal-hybrid articles wherein portions of the polymeric substrate and up to substantially the entire polymer substrate surface is imprinted with anchoring structures followed by selectively covering at least a portion of the polymer surface with the fine-grained or amorphous metallic coating layer(s), while not covering at least a portion of said imprinted polymer substrates to achieve hydrophobicity (contact angle for water of $\geq 90°$), preferably super-hydrophobicity (contact angle for water of $\geq 140°$) and self-cleaning behavior (tilt angle of $\leq 5°$), in the treated portions of the polymer substrate itself.

It is an objective of this invention to provide lightweight polymer/metal-hybrid articles with increased strength, stiffness, durability, wear resistance, thermal conductivity and thermal cycling capability.

It is an objective of this invention to provide polymer articles, coated with fine-grained and/or amorphous metallic layers that are stiff, lightweight, resistant to abrasion, resistant to permanent deformation, do not splinter when cracked or broken and are able to withstand thermal cycling without degradation, for a variety of applications including, but not limited to: (i) applications requiring cylindrical objects including gun barrels; shafts, tubes, pipes and rods; golf and arrow shafts; skiing and hiking poles; various drive shafts; fishing poles; baseball bats, bicycle frames, ammunition casings, wires and cables and other cylindrical or tubular structures for use in commercial goods; (ii) medical equipment including orthopedic prosthesis and surgical tools, crutches, wheel chairs, implants, pacemakers, hearing aids; (iii) sporting goods including golf shafts, heads and faceplates; lacrosse sticks; hockey sticks; skis and snowboards as well as their components including bindings; racquets for tennis, squash, badminton; bicycle parts; (iv) components and housings for electronic equipment including laptops; televisions and handheld devices including cell phones; personal digital assistants (PDAs) devices; walkmen; discmen; digital audio player, e.g., digital audio players, e.g., digital audio players, e-mail functional telephones; digital cameras and other image recording devices; audio and/or video recording devices; two-way radios; televisions and remote controls; (v) automotive components including heat shields; cabin components including seat parts, steering wheel and armature parts; fluid conduits including air ducts, fuel rails, turbocharger components, oil, transmission and brake parts, fluid tanks and housings including oil and transmission pans; cylinder head covers; spoilers; grill-guards and running boards; brake, transmission, clutch, steering and suspension parts; brackets and pedals; muffler components; wheels; brackets; vehicle frames; spoilers; fluid pumps such as fuel, coolant, oil and transmission pumps and their components; housing and tank components such as oil, transmission or other fluid pans including gas tanks; electrical and engine covers; (vi) industrial/consumer products and parts including linings on hydraulic actuator, cylinders and the like; drills; files; knives; saws; blades; sharpening devices and other cutting, polishing and grinding tools; housings; frames; hinges; sputtering targets; antennas as well as electromagnetic interference (EMI) shields, radio frequency interference (RFI) shields; (vii) molds and molding tools and equipment; (viii) aerospace parts and components including wings; wing parts including flaps and access covers; structural spars and ribs; propellers; rotors; rotor blades; rudders; covers; housings; fuselage parts; nose cones; landing gear; lightweight cabin parts; cryogenic storage tanks; ducts and interior panels; and (ix) military products including ammunition, armor as well as firearm components, and the like; that are coated with fine-grained and/or amorphous metallic layers that are stiff, lightweight, resistant to abrasion, resistant to permanent deformation, do not splinter when cracked or broken and are able to withstand thermal cycling without degradation.

It is an objective of this invention to at least partially coat the inner or outer surface of parts including complex shapes with fine-grained and/or amorphous metallic materials that are strong, lightweight, have high stiffness (e.g. resistance to deflection and higher natural frequencies of vibration) and are able to withstand thermal cycling without degradation.

Accordingly, the invention in one embodiment denoted the first embodiment, is directed to a metal-clad polymer article comprising:
  (i) a polymeric material which at room temperature has a coefficient of linear thermal expansion in the range between $30 \times 10^{-6}$ K$^{-1}$ and $250 \times 10^{-6}$ K$^{-1}$ in at least one direction; and
  (ii) a metallic material having a microstructure which is fine-grained with an average grain size between 2 and 5,000 nm and/or an amorphous microstructure, the metallic material being in the form of a metallic layer having a thickness between 10 micron and 2.5 cm and a coefficient of linear thermal expansion in all directions in the range between $-5.0 \times 10^{-6}$ K$^{-1}$ and $25 \times 10^{-6}$ K$^{-1}$;
  (iii) with or without at least one intermediate layer between the polymeric material and the metallic material (having a coefficient of linear thermal expansion in all directions in the range between $-5.0 \times 10^{-6}$ K$^{-1}$ and $250 \times 10^{-6}$ K$^{-1}$;
  (iv) an interface between the polymeric material and the metallic material or an interface between the polymeric material and any intermediate layer(s) and an interface between any intermediate layer(s) and the metallic material;
  (v) anchoring structure at said interface(s) comprising recesses and/or protrusions to increase the interface area and provide enhanced physical bond at the interface between the polymeric material and the metallic material or at the interface between the polymeric material and any intermediate layer(s) and at the interface between any intermediate layer(s) and the metallic material;
  (vi) said metal-clad polymer article exhibiting no delamination and the displacement of said metallic material of (ii) relative to the polymeric material of (i) or relative to any intermediate layer(s) being less than 2% to after said article has been exposed to at least one temperature cycle according to ASTM B553-71 service condition 1, 2, 3 or 4; and
  (vii) said metal-clad polymer article exhibiting a pull-off strength between the polymeric material of (i) and the metallic material of (ii) or any intermediate layer exceeding 200 psi as determined by ASTM D4541-02 Method A-E; and (viii) said metal-clad polymer article or portion thereof having a yield strength and/or ultimate tensile strength of between 10 and 7,500 MPa and an elastic limit between 0.5 and 30%.

Accordingly, the invention in another embodiment, denoted the second embodiment, is directed to a metal-clad polymer article comprising:
  (i) a polymeric material which at room temperature has a coefficient of linear thermal expansion in the range between $30 \times 10^{-6}$ $K^{-1}$ and $250 \times 10^{-6}$ $K^{-1}$, in at least one direction;
  (ii) a metallic material having a microstructure which is fine-grained with an average grain size between 2 and 5,000 nm and/or an amorphous microstructure, the metallic material being in the form of a metallic layer having a thickness between 10 micron and 2.5 cm and a coefficient of linear thermal expansion in all directions in the range between $-5.0 \times 10^{-6}$ $K^{-1}$ and $25 \times 10^{-6}$ $K^{-1}$; the coefficient of linear thermal expansion in all directions being at least 20% less than the coefficient of linear thermal expansion in at least one direction of (i);
  (iii) with or without at least one intermediate layer between the polymeric material and the metallic material having a coefficient of linear thermal expansion in all directions in the range between $-5.0 \times 10^{-6}$ $K^{-1}$ and $250 \times 10^{-6}$ $K^{-1}$; the coefficient of linear thermal expansion in all directions of (ii) being at least 20% less than the coefficient of linear thermal expansion in at least one direction of (i);
  (iv) an interface between the polymeric material and the metallic material or an interface between the polymeric material and any intermediate layer(s) and an interface between any intermediate layer(s) and the metallic material;
  (v) anchoring structure at said interface(s) comprising recesses and/or protrusions to increase the interface area and provide enhanced physical bond at the interface between the polymeric material and the metallic material or at the interface between the polymeric material and any intermediate layer;
  (vi) said metal-clad polymer article exhibiting no delamination and the displacement of said metallic material of (ii) relative to the polymeric material of (i) being less than 2% after said article has been exposed to at least one temperature cycle according to ASTM B553-71 service condition 1, 2, 3 or 4; and
  (vii) said metal-clad polymer article exhibiting a pull-off strength between the polymeric material of (i) and the metallic material of (ii) or any intermediate layer exceeding 200 psi as determined by ASTM D4541-02 Method A-E; and
  (viii) said metal-clad polymer article or portion thereof having a yield strength and/or ultimate tensile strength of between 10 and 7,500 MPa and an elastic limit between 0.5 and 30%.

Accordingly the invention in still another embodiment, denoted the third embodiment, is directed to a method for preparing the metal-clad polymer article of the first embodiment comprising:
  (i) providing a polymeric material which at room temperature has a coefficient of linear thermal expansion exceeding $30 \times 10^{-6}$ $K^{-1}$ in at least one direction.
  (ii) providing a metallic material having a microstructure which is fine-grained with an average grain size between 2 and 5,000 nm and/or an amorphous microstructure where the metallic material is in the form of a metallic layer having a thickness between 10 microns and 2.5 cm and a coefficient of linear thermal expansion in all directions in the range between $-5.0 \times 10^{-6}$ $K^{-1}$ and $25 \times 10^{-6}$ $K^{-1}$,
  (iii) optionally providing at least one electrically conductive or electrically nonconductive adhesive intermediate layer,
  (iv) providing interface(s) between the polymeric material and the metallic layer and between the polymeric material and any intermediate layer and between any intermediate layer and the metallic layer and between any adjacent intermediate layers,
  (v) providing anchoring structure at said interfaces to anchor polymeric material to metallic layer or polymeric material to any intermediate layer, and metallic layer to any intermediate layer or in the case of intermediate layers to anchor one intermediate layer to another.

In one aspect of the third embodiment the coefficient of linear thermal expansion in all directions of the metallic layer and of any intermediate layer(s) is at least 20% less than the coefficient of linear thermal expansion in at least one direction of the polymeric material. In one case of the third embodiment a metallic layer is deposited onto a polymeric substrate having anchoring structure associated therewith by electrodeposition, physical vapor deposition (PVD), and chemical vapor deposition (CVD). In another case of the third embodiment the polymeric material is applied to the metallic layer having anchoring structure associated therewith.

Accordingly the invention in still another embodiment, denoted the fourth embodiment, is directed to a polymeric material which at room temperature has a coefficient of linear thermal expansion in the range between $30 \times 10^{-6}$ $K^{-1}$ and $250 \times 10^{-6}$ $K^{-1}$ in at least one direction:
  (i) said polymer material having one or more outer surfaces;
  (ii) anchoring structures embossed in at least a portion of said outer surface(s) of said polymeric material comprising recesses and/or protrusions;
  (iii) said embossed portions exhibiting a contact angle for water of at least 100 degrees; and
  (iv) at least some of said portions being coated with a metallic material having a microstructure which is fine-grained with an average grain size between 2 and 5,000 nm and/or an amorphous microstructure.

Accordingly the invention in still another embodiment, denoted the fifth embodiment, is directed to a metal-clad polymer article comprising:
  (i) a polymeric substrate at least partially imprinted with anchoring structures to raise the contact angle for water in the imprinted areas to $\geq 100°$,
  (ii) a metallic material coating portions of said imprinted polymeric substrate having a microstructure which is fine-grained with an average grain size between 2 and 5,000 nm and/or an amorphous microstructure; and
  (iii) with or without at least one intermediate layer between the portions of the polymeric material coated with the metallic material.

Accordingly the invention in still another embodiment, denoted the sixth embodiment, is directed to a metal-clad polymer article comprising:
  (i) a polymeric substrate at least partially imprinted with anchoring structures to raise the contact angle for water in the imprinted areas by $\geq 10°$ when compared to the flat polymeric substrate surface of the same composition,
  (ii) a metallic material coating portions of said polymeric substrate having a microstructure which is fine-grained with an average grain size between 2 and 5,000 nm and/or an amorphous microstructure; and (iii) with or without at least one intermediate layer between the portions of the polymeric material coated with the metallic material.

As used herein, the terms "laminate article" and "metal-clad article" means an item which contains at least one polymeric layer and at least one metallic layer in contact with each other.

As used herein, the term "coating" means deposit layer applied to part or all of an exposed surface of a substrate.

As used herein, the term "coating thickness" or "layer thickness" refers to depth in a deposit direction.

As used herein, the term "variable property" is defined as a deposit property including, but not limited to, chemical composition, grain size, hardness, yield strength, Young's modulus, resilience, elastic limit, ductility, internal stress, residual stress, stiffness, coefficient of thermal expansion, coefficient of friction, electrical conductivity, magnetic coercive force, and thickness, being varied by more than 10% in the deposition direction and/or at least in one of the length or width directions. "Layered structures" have said deposit property varied by more than 10% between sublayers and the sublayer thickness ranges from 1.5 nm to 1,000 microns.

As used herein, "anodically assisted chemical etching" means that the surface of a polymeric substrate to be coated is activated by applying anodic polarization to the substrate which is submersed in a chemical etching solution thereby simultaneously chemically and electrochemically activating the surface to achieve a superior bond between the substrate and the subsequently applied coating.

As used herein the "inherent contact angle" or "intrinsic contact angle" is characterized by the contact angle for a liquid measured on a horizontal, flat and smooth surface not containing any surface structures.

As used herein the term "smooth surface" is characterized by a surface roughness Ra≤0.25 microns.

As used herein, "super-hydrophobicity" refers to a contact angle for de-ionized water at room temperature ≥140° and "self-cleaning" refers to a tilt angle of ≤5°.

As used herein, the term "tile angle" or "roll-off angle" means the smallest angle between a surface containing a water droplet and the horizontal surface at which the droplet commences to and keeps rolling off.

As used herein "texturing" or "roughening" the surface means that the nature of a surface is not smooth but has a distinctive rough texture created by the surface structures purposely introduced to render the surface fluid repellant.

As used herein, the term "anchoring structures" refers to surface features including recesses/protrusions purposely created in the interface between the polymeric material and the metallic material layer or the interface between the polymeric material and the intermediate layer, e.g., in the polymeric material or in the metallic material layer or in any intermediate layer, to enhance their bond strength.

As used herein, the term "population of anchoring structures" refers to number of surface features per unit length or area. The "linear population of anchoring structures" can be obtained by counting the number of features, e.g. on a cross sectional image and normalizing it per unit length, e.g., per cm. The average "areal population of anchoring structures" is the square of the average linear population, e.g., expressed in $cm^2$ or $mm^2$. Alternatively, the average areal density can be obtained by counting the number of features visible in an optical micrograph, SEM image or the like and normalizing the count for the measurement area.

As used herein, "surface roughness", "surface texture" and "surface topography" mean an irregular surface topography such as a polymer material or metallic material layer or intermediate layer surface containing anchoring structures. Surface roughness consists of surface irregularities which result from the various surface preconditioning methods used such as mechanical abrasion and etching to create suitable anchoring structures. These surface irregularities/anchoring structures combine to form the "surface texture" which directly influences the bond strength achieved between the polymeric article and the metallic layer.

In practice there are many different parameters used for analyzing surface finish, and many more have been developed for special products/circumstances. The parameter most frequently used in North America for surface roughness is Ra. It measures the average roughness by comparing all the peaks and valleys to the mean line, and then averaging them all over the entire length that a stylus is dragged across the surface. It's also referred to as CLA (center line average) and AA (area average). Benefits of using the Ra method are its simplicity and its widespread use. The RMS (root mean square) of a given surface typically runs about 10% higher than its equivalent Ra (average roughness) value.

In reality, however, the Ra value neither provides a detailed enough description of a surface finish of a part nor an absolute indication of the achievable adhesion strength when bonded to another material. Another parameter that can be useful is $Ry_{max}$ formerly called just $R_{max}$. This is an International Organization for Standardization (ISO) standard that measures the distance between the highest peak and the lowest valley over a cutoff length. This is, however, a sensitive method and, if over the measurement length a scratch or imperfection is encountered, the reading may be meaningless. Similarly, Ry depicts the maximum roughness depth.

Another parameter most widely used in Europe is Rz, or mean roughness depth. The Rz ISO standard is also called "Ten Point Average Roughness". It averages the height of the five highest peaks and the depth of the five lowest valleys over the measuring length, using an unfiltered profile. The Rz DIN standard averages the highest point and lowest point over five cutoffs.

As used herein, the term "intermediate layer" means a layer located between and in intimate contact with a polymeric material substrate and a metallic layer or another intermediate layer. Examples of intermediate layers include "intermediate conductive layers" or "metalizing layers" applied to the surface of the polymer material to enhance the surface to enable electroplating. The intermediate layer can comprise a metallic layer, an oxide layer, a polymeric material layer such as an adhesive layer, or a polymer layer with conductive particulates embedded therein.

As used herein, the term "molding" of polymers means shaping of an article to its near final shape using injection molding, blow molding, compression molding, transfer molding, rotational molding, extrusion, thermoforming, vacuum forming or other suitable shaping methods available for polymers.

As used herein "delamination" means failure of a laminated structure by the separation between two layers comprised of different chemical compositions resulting in the physical splitting of the layers.

As used herein "displacement" means the difference between a later position of a coating and its original position on a substrate caused by the relative movement of a coating, e.g., induced by thermal cycling of laminates composed of layers with different CLTEs.

According to one aspect of the present invention an article is provided by a process which comprises the steps of, positioning the metallic or metallized work piece to be plated in a plating tank containing a suitable electrolyte and a fluid circulation system, providing electrical connections to the work piece/cathode to be plated and to one or several anodes and plating a structural layer of a metallic material with an average grain size of equal to or less than 5,000 nm on the surface of the metallic or metallized work piece using suitable direct current (D.C.) or pulse electrodeposition processes described, e.g., in the copending application US 2005/020542, published Sep. 22, 2005 (DE 10,288,323; 2005).

Metal-clad polymer articles of the invention comprise fine-grained and/or amorphous metallic layers having low CLTEs e.g. $-5.0\times10^{-6}$ $K^{-1}$ to $25\times10^{-6}$ $K^{-1}$ in all directions, having a layer thickness of at least 0.010 mm, preferably more than 0.020 mm, more preferably more than 0.030 mm and even more preferably more that 0.050 mm on polymeric substrates having CLTEs in at least one direction of between $30\times10^{-6}$ $K^{-1}$ to $500\times10^{-6}$ $K^{-1}$.

Articles of the invention comprise a single or several fine-grained and/or amorphous metallic layers applied to the substrate as well as multi-layer laminates composed of alternating layers of fine-grained and/or amorphous metallic layers and polymeric substrates.

The fine-grained metallic coatings/layers have a grain size under 5 μm (5,000 nm), preferably in the range of 5 to 1,000 nm, more preferably between 10 and 500 nm. The grain size can be uniform throughout the deposit; alternatively, it can consist of layers with different microstructure/grain size. Amorphous microstructures and mixed amorphous/fine-grained microstructures are within the scope of the invention as well.

According to this invention, the entire polymer surface can be coated; alternatively, metal patches or sections can be formed on selected areas only (e.g. golf club face plates or sections of golf club shafts, arrows or polymer cartridge casings), without the need to coat the entire article.

According to this invention metal patches or sleeves which are not necessarily uniform in thickness and/or microstructure can be deposited in order to e.g. enable a thicker coating on selected sections or sections particularly prone to heavy use such as golf club face or sole plates, the tip end of fishing poles, arrows and shafts for golf clubs, skiing or hiking poles, polymer cartridge casings, automotive components and the like.

According to this invention laminate articles in one aspect comprise fine-grained and/or amorphous metal layers on carbon-fiber and/or glass fiber filled polymeric substrates.

The following listing further defines the laminate article/metal-clad article of the invention:
Polymeric Substrate Specification:
Minimum coefficient of linear thermal expansion in at least one dimension
[$10^{-6}$ $K^{-1}$]: 20; 25; 30; 50
Maximum coefficient of linear thermal expansion in at least one dimension
[$10^{-6}$ $K^{-1}$]: 250; 500

Polymeric materials comprise at least one of: unfilled or filled epoxy, phenolic or melamine resins, polyester resins, urea resins; thermoplastic polymers such as thermoplastic polyolefins (TPOs) including polyethylene (PE) and polypropylene (PP); polyamides, mineral filled polyamide resin composites; polyphthalamides, polyphthalates, polystyrene, polysulfone, polyimides; neoprenes; polybutadienes; polyisoprenes; butadiene-styrene copolymers; poly-ether-ether-ketone (PEEK); polycarbonates; polyesters; liquid crystal polymers such as partially crystalline aromatic polyesters based on p-hydroxybenzoic acid and related monomers; polycarbonates; acrylonitrile-butadiene-styrene (ABS); chlorinated polymers such polyvinyl chloride (PVC); and fluorinated polymers such as polytetrafluoroethylene (PTFE). Polymers can be crystalline, semi-crystalline or amorphous.

Filler additions: metals (Ag, Al, In, Mg, Si, Sn, Pt, Ti, V, W, Zn); metal oxides ($Ag_2O$, $Al_2O_3$, $SiO_2$, $SnO_2$, $TiO_2$, ZnO); carbides of B, Cr, Bi, Si, W; carbon (carbon, carbon fibers, carbon nanotubes, diamond, graphite, graphite fibers); glass; glass fibers; fiberglass metallized fibers such as metal coated glass fibers; mineral/ceramic fillers such as talc, calcium silicate, silica, calcium carbonate, alumina, titanium dioxide, ferrite, mica and mixed silicates (e.g. bentonite or pumice).
Minimum particulate/fiber fraction [% by volume]: 0; 1; 5; 10
Maximum particulate/fiber fraction [% by volume]: 50; 75; 95
Metallic Coating/Metallic Layer Specification:
Minimum coefficient of linear thermal expansion [$10^{-6}$ $K^{-1}$]: $-5.0$; $-4.0$; 0
Maximum coefficient of linear thermal expansion [$10^{-6}$ $K^{-1}$]: 15; 20; 25
Microstructure: Amorphous or crystalline
Minimum average grain size [nm]: 2; 5; 10
Maximum average grain size [nm]: 100; 500; 1,000; 5,000; 10,000
Metallic layer Thickness Minimum [nm]: 2.5; 10; 12.5; 25; 30; 50; 100
Metallic layer Thickness Maximum [μm]: 5; 25; 50
Metallic materials comprising at least one of Ag, Al, Au, Co, Cr, Cu, Fe, Ni, Mo, Pb, Pd, Pt, Rh, Ru, Sn, Ti, W, Zn and Zr
Other alloying additions: B, C, H, O, P and S
Particulate additions: metals (Ag, Al, In, Mg, Si, Sn, Pt, Ti, V, W, Zn); metal oxides ($Ag_2O$, $Al_2O_3$, $SiO_2$, $SnO_2$, $TiO_2$, ZnO); carbides of B, Cr, Bi, Si, W; carbon (carbon nanotubes, diamond, graphite, graphite fibers); glass; polymer materials (PTFE, PVC, PE, PP, ABS, epoxy resins)
Minimum Particulate Fraction [% by Volume]: 0; 1; 5; 10
Maximum particulate fraction [% by volume]: 50; 75; 95
Minimum Yield Strength Range [MPa]: 300
Maximum Yield Strength Range [MPa]: 2,750
Minimum Hardness [VHN]: 100; 200; 400
Maximum Hardness [VHN]: 800; 1,000; 2,000
Minimum Deposition Rates [mm/hr]: 0.01; 0.05; 0.1; 0.2; 0.5
Intermediate Layer Specification:
Metallic Layer: composition selected from metallic materials list set forth above, including electroless Ni, Cu, Co and/or Ag comprising coatings; metallic layers can contain an oxide layer on the outer surface, which can promote the bond strength to the polymer substrate.
Oxide layer: oxides of elements as listed in the metallic materials list, including Ni, Cu, Ag oxides
Polymeric Layer: composition selected from polymeric materials list including partly cured layers prior to coating and finishing heat treatment, also cured polymeric paint (carbon, graphite, Ni, Co, Cu, Ag filled curable polymers, adhesive layer).
Intermediate Layer Thickness Minimum [μm]: 0.005; 0.025;
Intermediate Layer Thickness Maximum [μm]: 1; 5; 25; 50
Interface Specification (Polymer/Intermediate Layer Interface or Polymer/Metallic Layer Interface):
Minimum surface roughness $Ra$, $Ry$, $Ry_{max}$, $Rz$ [μm]: 0.01; 0.02; 0.05; 0.1; 1
Maximum surface roughness $Ra$, $Ry$, $Ry_{max}$, $Rz$ [μm]: 25; 50; 500; 5,000
Minimum linear population of anchoring surface structures [number per cm]: 10; 100; 1,000
Maximum linear population of anchoring surface structures [number per cm]: $10^5$; $10^6$; $10^7$ Minimum areal population of anchoring surface structures [number per mm$^2$]: 1, 100; 10$^4$
Maximum areal population of anchoring surface structures [number per mm$^2$]: 10$^7$; 10$^{10}$
Minimum anchoring structure diameter [nm]: 10, 50, 100
Maximum anchoring structure diameter [μm]: 500; 1,000
Minimum anchoring structure height/depth [nm]: 10, 50, 100
Maximum anchoring structure height/depth [μm]: 500; 1,000
Anchoring surface structure topography: recesses; protrusions; "inkbottle type" cavities; pitted anchoring surface structures; holes; pores; depressions; anchoring surfaces with protruding anchoring fibers; grooved, roughened and etched anchoring surface structures; nodules; dimples; mounds; as well as honeycomb or open foam type structures; "brain", "cauliflower", "worm", "coral" and other three dimensionally interconnected porous surface structures. Typically any number of different anchoring structures is present in the suitably textured surface, their shapes and areal densities can be irregular and the clear identification of individual anchoring structures can be subject to interpretation. The most reliable method therefore to account for the effect of anchoring structures is to measure the adhesion property of the metal-clad polymer article, e.g., using the ASTM D4541-02 pull-off strength test.
Metal-Clad Polymer Article Specification:
Adhesion:
Minimum pull-off strength of the coating according to ASTM D4541-02 Method
A-E [psi]: 200; 300; 400; 600
Maximum pull-off strength of the coating according to ASTM D4541-02 Method
A-E [psi]: 2,500; 3,000; 6,000
Thermal Cycling Performance:
Minimum thermal cycling performance according to ASTM B553-71: 1 cycle according to service condition 1 without failure (no blistering, delamination or <2% displacement) and with <2% displacement between the polymer and metallic material layers.
Maximum thermal cycling performance according to ASTM B553-71: infinite number of cycles according to service condition 4 without failure.
Metal-Clad Polymer Article Mechanical Properties:
Polymer substrate weight fraction of the metal-clad polymer article [%]: 5 to 95
Minimum yield strength of the metal-clad polymer article [MPa]: 5; 10; 25; 100
Maximum yield strength of the metal-clad polymer article [MPa]: 5,000; 7,500.
Minimum ultimate tensile strength of the metal-clad polymer article [MPa]: 5; 25; 100
Maximum ultimate tensile strength of the metal-clad polymer article [MPa]: 5,000; 7,500
Minimum elastic limit of the metal-clad polymer article [%]: 0.5; 1
Maximum elastic limit of the metal-clad polymer article [%]: 5; 10, 30

The following description summarizes the test protocols used:
Adhesion Test Specification:
ASTM D4541-02 "Standard Test Method for Pull-Off Strength of Coatings Using Portable Adhesion Testers" is a test for evaluating the pull-off strength of a coating on rigid substrates determining the greatest perpendicular force (in tension) that a coating/substrate interface surface area can bear before it detaches either by cohesive or adhesive failure. This test method maximizes tensile stress as compared to shear stress applied by other methods, such as scratch or knife adhesion and the results may not be comparable. ASTM D4541-02 specifies five instrument types identified as test Methods A-E and the pull off strength reported is an average of at least three individual measurements.
Thermal Cycling Test Specification:
ANSI/ASTM specification B604-75 section 5.4 Test (Standard Recommended Practice for Thermal Cycling Test for Evaluation of Electroplated Plastics ASTM B553-71). In this test the samples are subjected to a thermal cycle procedure as indicated in Table 1. In each cycle the sample is held at the high temperature for an hour, cooled to room temperature and held at room temperature for an hour and subsequently cooled to the low temperature limit and maintained there for an hour.

TABLE 1

Standard Recommended Practice for Thermal Cycling Test for Evaluation of Electroplated Plastics According to ASTM B553-71

| Service Condition | High Limit [° C.] | Low Limit [° C.] |
|---|---|---|
| 1 (mild) | 60 | −30 |
| 2 (moderate) | 75 | −30 |
| 3 (severe) | 85 | −30 |
| 4 (very severe) | 85 | −40 |

If any blistering, delamination or cracking is noted the test is immediately suspended. After 10 such test cycles the sample is allowed to cool to room temperature, is carefully checked for delamination, blistering and cracking and the total displacement of the coating relative to the substrate is determined.

BRIEF DESCRIPTION OF THE DRAWINGS

FIG. 1 illustrates a picture of the top and bottom of a fully encapsulated coupon according to the invention illustrating the massive deformation of the metal-clad polymer article which occurred during the pull test without any delamination between the embossed and etched polymer and the metal layers.

DETAILED DESCRIPTION

This invention relates to laminate articles comprising structural metallic material layers on polymeric substrates that are suitably shaped to form a precursor of the metal-clad polymer article. The metallic materials/coatings are fine-grained and/or amorphous and are produced by DC or pulse electrodeposition, electroless deposition, physical vapor deposition (PVD), chemical vapor deposition (CVD) and gas condensation or the like. Debonding of the coating from the substrate due to the intrinsic mismatch of the coefficient of thermal expansion of the metal and the polymer of the inventive metal-clad polymer articles is overcome and acceptable thermal cycling performance achieved by enhancing the pull-off strength between the metallic material and the polymer by suitable surface activation and/or surface roughness and/or metal-polymer interface surface design.

The person skilled in the art of plating will know how to electroplate or electroless plate selected fine-grained and/or amorphous metals, alloys or metal matrix composites choosing suitable plating bath formulations and plating conditions. Similarly, the person skilled in the art of PVD, CVD and gas condensation techniques will know how to prepare fine-grained and/or amorphous metal, alloy or metal matrix composite coatings.

Applying metallic coatings to polymer and polymer composite parts is in widespread use in consumer and sporting goods, automotive and aerospace applications. Polymer composites with carbon/graphite and/or glass fibers are relatively inexpensive, easy to fabricate and machine; however, they are not very durable. Metallic coatings are therefore frequently applied to polymers and polymer composites to achieve the required mechanical strength, wear and erosion resistance and to obtain the desired durability and service life. To achieve the required durability of laminate articles excellent bond strength between the metallic layer and the polymer substrate is of paramount importance.

A variety of fine-grained and/or amorphous metallic coatings, which at room temperature have a coefficient of thermal expansion in the range between minus $5.0 \times 10^{-6}$ $K^{-1}$ and $25 \times 10^{-6}$ $K^{-1}$ in all directions, can be employed. Particularly suited are fine-grained and/or amorphous high-strength pure metals or alloys containing Ag, Al, Au, Co, Cr, Cu, Fe, Ni, Mo, Pb, Pd, Pt, Rh, Ru, Sn, Ti, W, Zn and Zr; and optionally one or more elements selected from the group consisting of B, C, H, O, P and S; and/or optionally containing particulate additions such as metal powders, metal alloy powders and metal oxide powders of Ag, Al, Au, Cu, Co, Cr, Fe, Ni, Mo, Pd, Pt, Sn, Rh, Ru, Ti, W, Zn and Zr; nitrides of Al, B and Si; C (graphite, carbon fibers, carbon nanotubes or diamond); carbides of B, Cr, Bi, Si, W; ceramics, glasses and polymer materials such as polytetrafluoroethylene (PTFE), polyvinylchloride (PVC), acrylonitrile-butadiene-styrene (ABS), polyethylene (PE), polypropylene (PP). The particulate average particle size is typically between 500 nm and 5 µm.

Metallic coatings can have a coarse-grained, fine-grained or amorphous microstructure. One or more metallic coating layers of a single or several chemistries and microstructures can be employed. The metallic coating can be suitably exposed to a finishing treatment, which can include, among others, electroplating, i.e., chromium plating and applying a polymeric material, i.e., paint or adhesive.

Polymeric substrates, for the most part have a CLTE significantly exceeding $25 \times 10^{-6}$ $K^{-1}$ in at least one direction. Selected polymeric materials and particularly filled or reinforced polymeric materials, can display coefficient of thermal expansion values which are not isotropic, but vary significantly with the direction. As an example, glass filled polyamide can have coefficient of linear thermal expansion (CLTE) values as low $20\text{-}75 \times 10^{-6}$ $K^{-1}$ in one direction and as high as $100\text{-}250 \times 10^{-6}$ $K^{-1}$ in another direction. In the case of fiber reinforced polymer materials, as fibers usually align in the plane of the part during molding, the CLTE of the polymer in the plane is typically lower than the CLTE perpendicular/normal to it. The degree of CLTE match or CLTE mismatch between the coating and the substrate and the bond strength between the coating and the substrate play an important role in preventing delamination and affecting the relative coating/substrate displacement in industrial composite parts exposed to thermal cycling. To clarify, the stronger the bond strength between the polymer and the metallic material the more CLTE mismatch and the higher the temperature fluctuations the metal-clad polymer article can endure. It is therefore of crucial importance to suitably roughen/pretreat/activate the polymeric surface to ensure the bond strength to the coatings and particularly metallic coatings is optimized. Of course, mechanical properties of the substrate and coating are important as well, particularly the yield strength, ultimate tensile strength, resilience and elongation. As known in the case of glass filled polymers the use of ammonium fluoride containing etchants has shown to enhance adhesion.

Suitable polymeric substrates include crystalline, semi-crystalline and/or amorphous resins as well as unfilled or filled resins. Suitable polymeric substrates include epoxy, phenolic and melamine resins, polyester resins, urea resins; thermoplastic polymers such as thermoplastic polyolefins (TPOs) including polyethylene (PE) and polypropylene (PP); polyamides, including aliphatic and aromatic polyamides, mineral filled polyamide resin composites; polyphthalamides; polyphthalates, polystyrene, polysulfone, polyimides; neoprenes; polybutadienes; polyisoprenes; butadiene-styrene copolymers; poly-ether-ether-ketone (PEEK); polycarbonates; polyesters; liquid crystal polymers such as partially crystalline aromatic polyesters based on p-hydroxybenzoic acid and related monomers; polycarbonates; acrylonitrile-butadiene-styrene (ABS); chlorinated polymers such polyvinyl chloride (PVC); and fluorinated polymers such as polytetrafluoroethylene (PTFE). Useful thermoplastic resins include poly(oxymethylene) and its copolymers; polyesters such as poly(ethylene terephthalate), poly(1,4-butylene terephthalate), poly(1,4-cyclohexyldimethylene terephthalate), and poly(1,3-propyleneterephthalate); polyamides such as nylon-6, 6, nylon-6, nylon-12, nylon-11, nylon-10,10, and aromatic-aliphatic copolyamides; polyolefins such as polyethylene (i.e. all forms such as low density, linear low density, high density, etc.), polypropylene, polystyrene, polystyrene/poly(phenylene oxide) blends, polycarbonates such as poly(bisphenol-A carbonate); fluoropolymers including perfluoropolymers and partially fluorinated polymers such as copolymers of tetrafluoroethylene and hexafluoropropylene, poly(vinyl fluoride), and the copolymers of ethylene and vinylidene fluoride or vinyl fluoride; poly-sulfides such as poly(p-phenylenesulfide); polyetherketones such as poly(ether-ketones), poly(ether-ether-ketones), and poly(ether-ketone-ketones); poly(etherimides); acrylonitrile-1,3-butadinene-styrene copolymers; thermoplastic (meth)acrylic polymers such as poly(methyl methacrylate); and chlorinated polymers such as poly(vinyl chloride), polyimides, polyamideimides, vinyl chloride copolymer, and poly(vinylidene chloride). Useful "thermotropic liquid crystalline polymer" (LCP) include polyesters, poly(ester-amides), and poly(ester-imides). One preferred form of polymer is "all aromatic", that is all of the groups in the polymer main chain are aromatic (except for the linking groups such as ester groups), but side groups which are not aromatic may be present. The thermoplastics may be formed into parts by the usual methods, such as injection molding, thermoforming, compression molding, extrusion, and the like.

These polymeric substrates frequently contain fillers including carbon, carbon nanotubes, graphite, graphite fibers, carbon fibers, metals, metal alloys, glass and glass fibers; fiberglass, metallized fibers such as metal coated glass fibers; pigments, dyes, stabilizers, toughening agents, nucleating agents, antioxidants, flame retardants, process aids, and adhesion promoters and the like. Appropriate filler additions in the substrate range from as low as 2.5% per volume or weight to as high as 95% per volume or weight. In addition to fibrous reinforcing fillers with a high aspect ratio, other fillers such as glass, ceramics and mineral fillers such as talc, calcium silicate, silica, calcium carbonate, alumina, titanium dioxide, ferrite, and mixed silicates (e.g. bentonite or pumice) can be employed as well.

Particularly suitable substrates include carbon/graphite fiber and glass fiber resin composites in which the resin components include phenolic resins, epoxy resins, polyester resins, urea resins, melamine resins, polyimide resins, polyamide resins as well as elastomers such as natural rubber, polybutadienes, polyisoprenes, butadiene-styrene copolymers, polyurethanes, and thermoplastics such as polyethylene, polypropylene, and the like.

During molding/shaping of the precursor metal-clad article, polymer chains do not necessarily align themselves in a random manner but rather display directionality depending on part geometry, molding conditions, material flow patterns etc. Similarly, fiber additions usually align in the plane and the electrical and thermal conductivities of such composites in a plane can be 10-100 times higher than perpendicular to the plane. Therefore, directional properties need to be considered in metal-clad polymer articles. Furthermore, non uniformity of the molded polymer or polymer matrix composite substrates can at times be exacerbated near the surface and significant differences in composition and properties near the outer surface layer, which participates in forming the bond to a coating layer and the interior bulk of the molded polymer, can exist.

To enhance the bond between the metallic layer, i.e., the metalizing/intermediate layer or the fine-grained/amorphous metallic layer and the polymer, polymeric surfaces forming the interface with the metallic layer are typically preconditioned before the metallic layers are applied. Numerous attempts have been made to identify, characterize and quantify desired surface features which result in achieving the desired bonding properties and to quantify the surface topography and surface roughness in quantifiable scientific terms. Heretofore, these efforts have not succeeded in part because of the complexity of the surface features, the numerous parameters such as population, size and shape of the anchoring structures which affect the mechanical interlocking. Furthermore, it is not even clear if the bond strength between metals and polymers is entirely dictated by mechanical forces or if chemical interactions, e.g., between functional surface groups of the polymers present or introduced during etching, contribute to the bond strengths as typically after etching the contact angle is reduced due to the creation of hydrophilic functional groups, i.e., —COOH and —COH. Similarly, the metal surface at the interface can be at least partially oxidized which at times can enhance the adhesion.

Anchoring structures are surface features induced on the polymeric surface by the various surface preconditioning methods used including, but not limited to, mechanical abrasion, swelling, dissolution, chemical etching and plasma etching, and furthermore depend on the composition of the polymer substrate and the amount, size and shape of fillers employed. In practice when dealing with polymeric and metallic surfaces that are pretreated to improve adhesion, surface features are usually quite irregular and difficult to describe/measure in absolute terms and attempts to quantify surface features responsible for good adhesion between the coating and the substrate have not been successful to date. Alternatively, as outlined in another preferred embodiment the polymer can be applied to a suitably rough metal substrate.

Over time a variety of standardized tests measuring adhesion have been developed and results from one test are frequently not comparable with results obtained with another test. The most popular test for adhesion between the metallic coating and a polymer substrate are peel tests. The force measured to peel a thin coating off the substrate relates to a force required to propagate debonding and before the test is initiated the coating is purposely debonded from the substrate. Peel tests measure the interfacial fracture energy and are used to characterize adhesive and thin metal coatings (decorative coatings) up to a thickness of 20 microns. When the thickness and the strength of the coatings increase, e.g., in the case of thick structural coatings/layers employing fine-grained metallic coatings, peel tests do not provide meaningful results. Pull-off tests, on the other hand, measure the force required to debond a unit area of the interface of the substrate and the coating and, in the case of metal-clad polymer articles with structural metallic layers, they are more relevant as the objective is to increase the force required for initiation of debonding as much as possible. In contrast to peel tests, pull-off test results are unaffected by the coating thickness. As illustrated in selected examples below there is no reliable correlation between pull-off and peel strength data.

Ways are sought to enable tolerating a larger CLTE mismatch between a metallic coating/layer and polymeric materials/substrates employed in strong, lightweight and structural laminate/metal-clad polymer articles as the bond strength achieved remains significantly below the one achieved between metallic coatings and metallic substrates. As the appropriate surface preparation of the substrate is known to have a significant impact on the bond strength and adhesion, the preferred approach is to provide means of substantially enhancing the bond strength between the metallic layer and the polymer. As highlighted, the surface topography created during the pretreatment procedure has a significant effect on adhesion. Ideally, when employing surface pretreatment methods, anchoring structures selected from the group of "inkbottle type" cavities, pitted anchoring surface structures, nodules, anchoring surfaces with protruding anchoring fibers, grooved, roughened and etched anchoring surface structures are formed at the interface between the metallic layer and the polymeric substrates and interlock the metallic and polymer layers raising the adhesion strength. The number, population density, shape, size and depth of anchoring structures greatly affects the bond strength achievable and therefore standardized adhesion tests are required to determine and objectively compare bond quality such as ASTM D4541-02.

Platable polymeric compositions therefore frequently employ "removable fillers" which are extracted from the near surface of the metal-polymer interface by a suitable pretreatment prior to metal deposition. In the case of polymer composites containing "permanent fibers" pretreatment methods and conditions can be optimized to "expose" some of the embedded fibers to enable the coating to adhere thereto and, at least partially encapsulate them, again resulting in enhanced bond strength and in an increase in CLTE mismatch between the coating and the substrate that can be tolerated. Many suitable polymeric compositions therefore contain both removable and permanent fillers. Leaching of the removable fillers alone without the creation of additional anchoring structures has been determined not to create a sufficiently high population of anchoring structures to meet the pull-off strength requirement of the metal-clad polymer article.

Desired metallic material-polymeric material interface surface features can be generated in a shaped polymer precursor article or a metallic layer in several ways:

1. Mechanical Surface Roughening of the Polymer and/or Metal Interface:

The surface of the substrate to be coated can be suitably roughened by a mechanical process, e.g., by sanding, grid blasting, grinding and/or machining.

2. Imprinting of the Polymer Surface by Molding and/or Other Shaping Methods:

Desirable anchoring structures can be imprinted/patterned on the surface of the substrate to be coated by suitable polymer molding, stamping, forming and/or shaping methods, all applying pressure to the soft, softened or molten polymer surface, including but not limited to injection, compression and/or blow molding, and "print rolling". All polymer forming and shaping processes can be, in principle, adapted to impart or transfer the desired surface texture to the polymer substrate surface.

A particularly elegant way of creating the desired surface features in polymers in a reproducible manner involves embossing the polymer surface with a suitable die as described in co-pending application Integran 6238 by J. J. Victor entitled "Articles with Super-Hydrophobic and/or Self-Cleaning Surfaces and Methods of Making Same". A suitable process for producing suitable nanostructured and microstructured depressions in a mold entails, e.g., placing suitable metallic embossing inserts into the mold or coating the mold surface itself. The microstructure of these metallic embossing dies is preferably amorphous or fine-grained, which was found to provide superior properties than the use of conventional coarse-grained metallic materials. The embossing dies preferably comprise at least one element selected from the group consisting of Ni, Co and Fe. To generate the embossing topography these amorphous or fine-grained metal surfaces are preferably shot peened and/or etched to create the desired surface feature die. Shot peening followed by etching has been found to create particularly desirable features. These surface features are transferred onto the polymer surface by embossing by application of pressure and/or heat preferably above the softening temperature for the polymer. In addition to substantially enhancing the adhesion strength between the polymer substrate and the applied coating, these processes have also been found to increase the contact angle for water and can be used to render the treated surface superhydrophobic and self-cleaning.

3. Chemical Etching of the Polymer and/or Metal Interface Near-Surface:

Chemical etching using oxidizing chemicals such as mineral acids, bases and/or oxidizing compounds such as permanganates is the most popular method for etching polymers practiced in industry. This method also benefits from the use of "platable polymer grades" which contain filler materials which, in the near outer surface layer, are dissolved during the etching process.

The co-pending application by McCrea entitled "Anodically Assisted Chemical Etching of Conductive Polymers and Polymer Composites" (U.S. Ser. No. 12/476,506) discloses a surface activation process for conductive polymers/polymer composites consisting of simultaneously applying anodic polarization and chemical etching, referred to as "anodically-assisted chemical-etching" or "anodic assisted etching". This process drastically enhances the bond strength between the activated substrate and the applied coating. Simultaneous chemical and electrochemical etching of polymeric substrates substantially enhances the bond, peel and shear strength between the polymeric substrate and the applied metallic coating/layer as highlighted in the co-pending application.

Solvent free chemical etching can be employed as well, to etch and/or suitably texture the outer surface including plasma etching or etching with reactive gases including, but not limited to, $SO_3$ and $O_3$, to suitably precondition and texture the surface. Special additives can further enhance adhesion, i.e., in the case of glass filled polymers the use of fluoride-ions containing etchants greatly enhances adhesion.

4. Swelling of the Polymeric Substrate Surface:

Application of swelling agents to create anchoring structures in the near surface of the polymer with or without the use of etching and abrasion methods can be employed. Suitable swelling agents include organic solvents for one or more polymers in the substrate including, but not limited to alcohols such as glycols.

5. Applying Adhesive Layers or Partially Cured Polymeric Substrates:

Where applicable, partly cured polymer substrates may be activated and coated, followed by an optional curing heat treatment. Similarly, adhesive layers may be applied between the polymeric substrate and the metallic coating which can also be followed by an optional curing heat.

6. Post Cure Treatment of Metal-Clad Polymer Articles:

Another process that can be used to improve the adhesion between the polymeric substrate and the metallic layer entails a suitable heat treatment of the metal-clad article for between 5 minutes and 50 hours at between 50 and 400° C.

7. Applying the Polymer to a Rough Metal Surface:

Another approach entails first forming the metallic layer with one surface to be covered by the polymer purposely "roughened" and containing suitable surface features/protrusions/surface roughness to create anchoring structures elevating from the metallic surface, recessing into the metal surface or their combinations, to aid in enhancing the adhesion to the polymeric substrate. In this case the polymeric material is applied onto the metallic material and not vice-versa.

Combinations of two or more of the aforementioned processes can be used as well and the specific pretreatment conditions typically need to be optimized for each polymer and molded part to generate a sufficiently high number of anchoring structures to maximize the bond strength which can be conveniently determined using the pull off test described.

To illustrate the incredible, heretofore unachieved, bond strength between polymers and metals possible according to this invention FIG. 1 illustrates samples which underwent the ASTM D4541-02 "Standard Test Method for Pull-Off Strength of Coatings Using Portable Adhesion Testers" without any delamination or loss of adhesion between the metal(s) and the polymer. This test involves attaching a pull stub (dolly) to the flat face of the metallic coating using an adhesive. After suitable curing the coating around the dolly is cut all the way to the substrate. After preparation the assembly is transferred to a measuring device in which a coupling connector locks on to the dolly, and a pressure source applies an increasing normal force on the dolly. When the pressure on the dolly is greater than the bond strength between the coating and the substrate, separation occurs and the connector-dolly assembly lifts the coating from the substrate. A pressure gage records the pressure at separation, which is the reported pull-off strength in psi. As FIG. 1 indicates selected samples, particularly samples which were embossed and etched, exhibit such a high adhesion strength between the polymer and the metallic layers that the metal coating and polymer severely deform and lift out of the sample plane without failure or any signs of delamination of the polymer-metal interface, i.e., the pull-off strength could not be determined according to ASTM D4541-02. Specifically to FIG. 1, the picture on the left depicts the view from the bottom of metal-clad glass-filled polyamide sample (embossed, etched in sulfochromic acid with glycol and F') after a pull-off test, clearly indicating the severe deformation (cupping) that occurred during the pull off test. The picture on the right displays the top view with the metal-clad filled polypropylene sample (embossed, etched in sulfochromic acid) and the pull stub or dolly still attached indicating that the bottom of the pulls tub or dolly and the adjacent metal-clad polymer layer significantly lifted out of the original base plane, again without any signs of delamination at the metal/polymer interface.

As highlighted, carbon-fiber and/or graphite-fiber and/or glass-fiber (referred to as carbon/graphite/glass-fiber) polymer composite molds are popular for sporting goods, automotive and aerospace parts and for fabricating composite prototypes for the aerospace industry. Carbon/graphite/glass-fiber polymer composite molds are inexpensive but lack durability and therefore find use only for prototyping. Depositing, e.g., fine-grained and/or amorphous metals such as Ni, Co, Cu and/or Fe-based alloys onto the carbon/graphite-fiber polymer composite molds provides for tremendous cost savings over the traditional approach of machining and forming Invar molds.

Similarly, carbon/graphite-fiber polymer composites are also a popular choice for aerospace components including plane fuselage, wings, rotors, propellers and their components as well as other external structures that are prone to erosion by the elements including wind, rain, hail and snow or can be damaged with impact by debris, stones, birds and the like. Aerospace and defense applications particularly benefit from a strong, tough, hard, erosion-resistant fine-grained and/or amorphous coating. Lightweight laminate articles are also employed in internal airplane parts.

Suitable laminate metallic-material/polymeric-material articles include, but are not limited to, precision graphite fiber/epoxy molds used in aerospace, automotive and other industrial applications that are exposed to repeated temperature cycling (between −75° C. and up to 350° C.), Metal-clad polymer parts made from the fine-grained and/or amorphous metallic coatings on appropriate substrates are well suited for high precision molding components requiring great dimensional stability over a wide operating temperature range.

In applications where coatings are applied to substrates it has been desired for the coefficient of linear thermal expansion (CLTE) of, e.g., the metal coating to be closely matched to the CLTE of the polymeric substrate or polymer composite to avoid delamination/failure during thermal cycling. Similarly in molding applications (blow, injection, compression molding and the like) good matching of the thermal expansion properties of all components is conventionally required to avoid spring-back and delamination during the heating and the cooling cycle. The tolerable "CLTE mismatch" between the metallic layer and the polymer depends on the application, the quality of the adhesion between the coating and the polymer substrate, the maximum and minimum operating temperature and the number of temperature cycles the article is required to withstand in its operating life. In all instances, after a predetermined number of thermal cycles, consisting either of submersing the article in liquid nitrogen for one minute followed by submersion in hot water for one minute, or other suitable thermal cycling tests including ANSI/ASTM specification B604-75 section 5.4 Test (Standard Recommended Practice for Thermal Cycling Test for Evaluation of Electroplated Plastics ASTM B553-71), the coating relative to the underlying substrate should not fail. Delamination, blistering or cracking of the coating and/or the substrate which would compromise the appearance or performance of the article are all considered failure. Similarly, a displacement of the coating relative to the underlying substrate of more than 2% constitutes failure.

Suitable permanent substrates include polymeric materials filled with or reinforced with e.g. graphite or glass which reduces the CLTE in at least the plane of the polymeric substrate. For added strength, durability and high temperature performance filled polymers are very desirable. The term "filled" as used herein refers to polymer resins which contain fillers embedded in the polymer, e.g., fibers made of graphite, carbon nanotubes, glass and metals; powdered mineral fillers (i.e., average particle size 0.2-20 microns) such as talc, calcium silicate, silica, calcium carbonate, alumina, titanium oxide, ferrite, and mixed silicates. A large variety of filled polymers having a filler content of up to about 95% by weight are commercially available from a variety of sources. If required, e.g., in the case of electrically non-conductive or poorly conductive substrates and the use of electroplating for the coating deposition, the substrates can be metallized to render them sufficiently conductive for plating.

As highlighted, a number of processes can be used to form the metal-clad polymer articles. In the case of using electroplating to apply the metallic layer to the polymer substrate, the polymer substrate, after suitably being appropriately shaped and activated, is preferably metallized to enhance the surface conductivity typically by applying a thin layer called the "intermediate conductive layer" or "metalizing layer". The intermediate conductive layer can comprise a metallic layer or can comprise polymeric material with conductive particulates therein. Where the intermediate conductive layer comprises a metallic layer, the metallic layer is constituted of Ag, Ni, Co or Cu or a combination of any two or all of these, and the intermediate conductive layer can be deposited by electroless deposition, sputtering, thermal spraying, chemical vapor deposition, physical vapor deposition of by any two or more of these. Where the intermediate conductive layer comprises polymeric material with conductive particulates therein, it can be, for example, a conductive paint or a conductive epoxy. The conductive particulates can be composed of or contain Ag, Ni, Co or Cu or graphite or other conductive carbon or a combination of two or more of these. As highlighted the surface of the metal layer or metal particulates can be oxidized to enhance adhesion.

As highlighted, the metal-clad polymer articles comprising the fine-grained and/or amorphous metal coatings, provide for lightweight parts exhibiting high strength, rigidity and impact performance for numerous applications and/or provide for further desired functional properties. In the case of electrical or electronic components or housings, the metal layer or preferably multi-compositional conformal metal layers can be designed and placed on selected sections or the entire part to enhance the thermal conductivity and improve heat dissipation from heat sources such as batteries or electronic components. Cu, Ag, Au and their alloys are known to have excellent thermal conductivity. The thermal conductivity can be further enhanced by particulate additions, particularly diamond. Such metal, metal alloy, or metal matrix composite layers can conveniently be formed on the substrate or an intermediate conductive layer by electroless, electrodeposition and/or spraying processes. Furthermore, conformal electromagnetic interference (EMI) and/or radio frequency interference (RFI) shielding layer or layers comprising metals or alloys selected from the group consisting of Ni, Co and Fe can be applied by various deposition techniques including electroplating.

Regarding heat dissipation, polymeric materials (ABS, nylon polypropylene) have thermal conductivities 200-4,000 times lower than popular metals such as Al, Ag, Cu, Ni, steel and NiFe alloys and heat dissipation can become a significant issue resulting in malfunction caused by overheating. Encapsulation of the polymer part or housing by or applying selective metallic patches strategically near areas of heat generation (battery, electronic circuit) with metallic materials, preferably comprising at least one element selected from the group consisting of Ag, Cu, Co, Ni, Fe, Sn and Zn and thermal conductivities exceeding 10 W/(m.K), preferably exceeding 100 W/(m.K) and up to 2,500 W/(m.K), optionally containing particulates of high thermal conductivity such as diamond [thermal conductivities >900 W/(m.K)], preferably to a total thickness of at least 12.5 microns and more preferably of at least 25 microns, are desired. A single layer or multiple layers of fine-grained or amorphous Cu and its alloys including Cu—Sn (bronze) and Cu—Zn (brass), optionally containing diamond particulates ranging from 1 to 50% per volume, which can be applied to the inside and/or outside of suitable polymer substrates, an intermediate metallic layer, or a fine-grained or an amorphous metallic layer by electroless deposition or electrodeposition, are particularly suitable to enhance heat-dissipation.

Similarly, electromagnetic interference (EMI) shielding and radio frequency interference (RFI) shielding can be significantly enhanced when suitable fine-grained or amorphous metallic materials comprising at least one element selected from the group consisting of Ni, Co, Cu, Fe, Mo, W, Zn, P, B, and C are applied directly to the inside and/or outside of electrical and electronic covers and housing. Suitable conformal metallic coatings preferably comprise Fe alloyed with Co and/or Ni, having a minimum Fe content of 5% and a minimum content of Ni and/or Co together of 2.5%. Additional metallic layers can be added, i.e., for decorative purposes and to enhance the wear performance, such as Cr. Paints or other synthetic coatings can be applied as well.

To achieve antimicrobial properties preferably the outer metallic layer consists of an amorphous or fine-grained metallic coating comprising at least one metal selected from the group consisting of comprising Ag, Co, Cu and Ni.

For a number of applications including, but not limited to, appearance, ease of gripping/holding or antimicrobial use, it is desirable that the outer metal surface is not perfectly smooth, but rough. This can be achieved either by post-treatment of the metal surface using a mechanical or chemical roughening process or care is taken that part of the polymer surface structures of the substrate are retained in the outer surface of the metallic coating by avoiding leveling/filling of the recesses. Such desirable satin metal finishes have a surface roughness of Ra between ≥0.5 microns and ≤50 microns.

The following working examples illustrate the benefits of the invention, specifically a comparison of pull-off and peel strength data for two sets of metal-clad polymer samples processed the same way, namely ABS polymeric substrate coated with an organic adhesive layer that is partially cured, then coated with a Ag intermediate layer and a fine-grained Ni—Fe layer, followed by heat treatment to fully cure the part (Working Example I); mechanically abraded graphite-fiber epoxy substrates coated with fine-grained nickel (Working Example II); chemically and anodically etched carbon fiber cloth reinforced bismaleimide substrates, then coated with a Ag intermediate layer and coated with a fine-grained nickel-iron alloy (Working Example III); chemically etched graphite-fiber and glass fiber reinforced polymer substrates coated with nickel-based materials with an amorphous or fine-grained microstructure using an intermediate conductive Ag layer (Working Example IV); coating of fully-cured and partially-cured graphite reinforced polymer composites with a silver (Ag) intermediate layer and a fine-grained Ni layer, including heat treatment of the partially-cured coated part (Working Example V); coating of a chemically etched glass fiber reinforced polyamide polymer composite with a Ni—P intermediate layer with a fine-grained Ni metal layer, followed by a post-plating heat-treatment (Working Example VI); and a polypropylene backing layer applied to a fine-grained Co—P metal layer with a rough interface surface produced electrochemically (Working Example VII); coating of a molded embossed polypropylene cell phone casings, followed by chemical etching, metalized with a Ni—P intermediate layer and electroplated with a fine-grained Cu layer and a fine-grained Ni—Co—Fe metal layer (Working Example VIII); coating of a molded embossed polyamide cell phone casings, followed by chemical etching, metalized with a Cu intermediate layer and electroplated with a fine-grained Cu layer, a fine-grained Ni—Fe metal layer, and a number of top coat layers (Working Example IX); and coating of a molded polyamide or polypropylene parts without and with compression molding embossing, followed by chemical etching, metalized with a Ni—P intermediate layer and electroplated with a fine-grained Ni layer (Working Example X); Intermediate metalizing layers were used in Working Examples I, III, IV, V, VI and VIII, IX and X.

The invention is illustrated by the following working examples.

Working Example I

Comparison of Pull-Off and Peel Strength for High Density ABS Substrate Coated with an Adhesive Layer, then Metallized with an Ag Intermediate Layer and a Fine-Grained Ni—Fe Layer with and without Heat Treatment of the Coated Part Two 10×15 cm coupons were cut from a commercial 6 mm ABS sheet (CLTE: ~75×10$^{-6}$ K$^{-1}$ in all directions) The coupons were ground on one side with 80 grit SiC paper to a consistent surface roughness. The samples were then cleaned with Alconox and steel wool, followed by ultrasonically cleaning in deionized water for 5 minutes. The samples were rinsed in isopropanol, dried and degreased with 1,2-dichloroethane to remove any residual oils and/or films.

Subsequently, the coupons were coated on one side with a thin film of a commercial epoxy-based adhesive available from Henkel Canada, Brampton, Ontario (LePage 11). The epoxy based adhesive coating was then partially cured at room temperature for 2 hours. Thereafter the panels were chemically etched at 65° C. for 5 minutes in alkaline permanganate solution (M-Permanganate P, Product Code No. 79223) available from MacDermid Inc. of Waterbury, Conn., USA. Following etching, the samples were rinsed in deionized water and submerged in neutralizer solution (M-Neutralize, Product Code No. 79225 also available from MacDermid Inc.) for 5 minutes at room temperature. After neutralizing, the samples were rinsed with deionized water and metalized using a commercial silvering solution (available from Peacock Laboratories Inc., of Philadelphia, Pa., USA; average grain size 28 nm) and coated with 20 μm of fine-grained Ni-58Fe (average grain size ~20 nm, CLTE: ~2×10$^{-6}$ K$^{-1}$) according to the process of US 2005/0205425, published Sep. 22, 2005, the whole of which is incorporated herein by reference.

The metal clad articles had a yield strength of 44.6 MPa, an ultimate tensile strength of 47.3 MPa, a Young's modulus of 2.4 GPa and an elastic limit of 1.8%.

One of the panels was then subjected to a post-coating curing treatment consisting of heat treating the sample in a drying oven for an additional 2 hours at 50° C. to fully cure the adhesive film. Pull-off and peel adhesion strength of the coatings on the two samples was then measured following ASTM D4541-02 "Standard Test Method for Pull-Off Strength of Coatings Using Portable Adhesion Testers" using the "PosiTest AT Adhesion Tester" available from the DeFelsko Corporation of Ogdensburg, N.Y., USA and ASTM B533-85(2004) "Standard Test Method for Peel Strength of Metal Electroplated Plastics" using an Instron 3365 testing machine equipped with the 90 degree peel test fixture, and a 5 KN load cell, available from Instron Corporation, Norwood, Mass., USA. In all eases debonding occurred between the polymer material surface and the immediately adjacent metal layer.

The pull-off and peel adhesion strength for the two samples is summarized in the table below. While the pull-off strength was high and essentially the same for both samples, the sample that received a post-coating heat treatment to fully cure the adhesive film displayed a much higher peel strength (more than three fold). This example illustrates that pull off tests and peel tests are not interchangeable and do not produce results which are comparable. Specifically to this example, as highlighted, pull-off strength exceeding 1,000 psi is considered "excellent" for structural metal-clad polymer parts. A peel strength value of 4 N/cm (Newton/cm), in the case of decorative metal coatings on polymers, is considered to be "very poor", whereas a peel strength value of 12.5 N/cm is considered "excellent".

TABLE 2

Pull-Off Strength Data (ASTM D4541-02) and Peel Strength Data (ASTM B533-85) for Samples With and Without Post Cure Heat Treatment.

| | Pull-off Strength (ASTM D4541-02) [psi] | Peel Strength (ASTM B533-85) [N/cm] |
|---|---|---|
| Sample 1 without post-cure heat treatment | 1075 | 4.0 |
| Sample 2 with post-cure heat treatment | 1100 | 12.5 |

Similar results were obtained when the intermediate layer comprised "electroless Ni", available from various commercial vendors and consisting of amorphous Ni—P, with a P content ranging from 2-15%, including Ni-7P available from MacDermid Inc., Waterbury, Conn., USA.

Working Example II

Fine-Grained Ni Coated Graphite Reinforced Composite Activated by Mechanical Abrasion Graphite fiber/epoxy sheets (6 mm thick) were sourced from Newport Adhesives and Composites, Irvine, Calif., USA, and were cut into 5 cm by 5 cm coupons. The surface of the coupons was mechanically ground using P1000 sandpaper exposing carbon fibers. The CLTE of the coupon in the plane was $5 \times 10^{-6}$ $K^{-1}$ and normal to the plane $60 \times 10^{-6}$ $K^{-1}$. After surface preparation the surface roughness of the coupons was determined to be Ra ~2.0 micron and $Ry_{max}$ ~10.0 micron. Microscope analysis revealed that the anchoring structures predominately included cross-hatched grooves and their population amounted to about 1,000 per cm. The coupons were encapsulated to a coating thickness of ~50 micron by depositing fine-grained Ni-20Fe alloys (average grain size ~20 nm, CLTE: ~$11 \times 10^{-6}$ $K^{-1}$) from a modified Watts nickel bath and using a Dynatronix (Dynanet PDPR 20-30-100) pulse power supply as described in US 2006/0135281-A1, published Jun. 22, 2006, the whole of which is incorporated herein by reference.

The metal clad articles had a yield strength of 606 MPa, an ultimate tensile strength of 614 MPa, a Young's modulus of 71 GPa and an elastic limit of 0.9%.

Coated samples were exposed to a thermal cycling test which involves vertical submersion into liquid nitrogen (T=−196° C.) for one minute, immediately followed by submersion in hot water (T=90° C.) for one minute. After ten cycles the sample is inspected for delamination, blistering, cracks and the like and the relative displacement of the coating determined. Thirty such thermal cycles were performed. All samples passed the liquid nitrogen/hot water cycling test without delamination. In addition, another set of samples was exposed to 10 thermal cycles according to the ANSI/ASTM specification B604-75 section 5.4 Thermal Cycling Test for Service Condition 4 (85° C. to −40° C.) without failure. Thereafter, the adhesion between the metallic layer and the polymeric substrate was determined using ASTM D4541-02 Method E using the self alignment adhesion tester type V described in Annex A5, specifically the "PosiTest AT Adhesion Tester" available from the DeFelsko Corporation of Ogdensburg, N.Y., USA. The data are displayed in Table 3.

TABLE 3

Thermal Cycling/Adhesion Test Results

| Substrate Chemistry | Min/Max Substrate CLTE [$10^{-6}$ $K^{-1}$] | Coating Chemistry (Average Grain Size in nm) | Coating CLTE [$10^{-6}$ $K^{-1}$] | Thermal Cycling Test (−196/90° C.) Performance after 10 cycles/ Displacement $\Delta L/L$ [%] | ANSI/ASTM specification B604-75 section 5.4 Thermal Cycling Test/SC4; 10 cycles/ Displacement $\Delta L/L$ [%] | Pull-Off Strength ASTM D4541-02 Method E after 10 cycles of ASTM B604-75/SC4 [psi] |
|---|---|---|---|---|---|---|
| Graphite Fiber/Epoxy Composite | 5/60 | 80Ni—20Fe (15 nm) | 11 | Pass/~0 | Pass/~0 | 350 |

Working Example III

Fine-Grained Ni-58Fe Coated Carbon Fiber Cloth Reinforced Bismaleimide Polymer Composite Activated by Various Chemical and Anodically Assisted Chemical Etching Methods, Use of a Metalizing Layer 3.75×8.75 cm coupons were cut from an 6 mm thick fully cured conductive carbon-fiber reinforced plastic (CFRP) sheet of HTM 512, a bismaleimide pre-impregnated carbon fiber cloth composite used in high temperature resistant composite tooling available from the Advanced Composites Group Ltd. of Heanor, Derbyshire, United Kingdom. The CLTE of the substrate material is $3 \times 10^{-6}$ $K^{-1}$ in the plane and $70 \times 10^{-6}$ $K^{-1}$ in the direction normal to the plane. The initial substrate preparation procedure was as follows: (i) mechanically abrading all exposed surfaces using 320 grit to a uniform finish, (ii) scrubbing with steel wool and Alconox cleaner, followed by a rinse in deionized water and (iii) rinsing with isopropanol, followed by drying. Thereafter the composite coupons were processed in various etching solutions, namely an alkaline permanganate etch, a chromic acid etch, a sulfuric acid etch and a sodium hydroxide etch with and without anodic assist. Microscope analysis revealed anchoring structures which included cross-hatched grooves, cavities, pitted anchoring structures and protruding anchoring fibers and, depending on the sample, their population amounted to between about 3,000 and about 25,000 per cm for the samples which passed the thermal cycling test. Subsequently, the samples were metalized using a commercial silvering solution (available from Peacock Laboratories Inc., of Philadelphia, Pa., USA; average grain size 28 nm) and coated on one side with a 50 µm thick layer of fine-grained Ni-58Fe (CLTE: ~$2\times10^{-6}$ $K^{-1}$, average grain size ~20 nm) according to US 2005/0205425, published Sep. 22, 2005.

The metal clad articles had a yield strength of 604 MPa, an ultimate tensile strength of 608 MPa, a Young's modulus of 71 GPa and an elastic limit of 0.9%.

Following plating, the adhesion strength was measured using ASTM D4541-02 Method E "Standard Test Method for Pull-Off Strength of Coatings Using Portable Adhesion Testers" using the "PosiTest AT Adhesion Tester" made by DeFelsko Corporation of Ogdensburg, N.Y., USA. In all cases depending occurred between the polymer material surface and the adjacent metal layer. Samples were also exposed to 10 cycles according to ANSI/ASTM specification B604-75 section 5.4, service condition 4.

For each different etch solution chemistry, CFRP samples were tested under 3 different conditions: 1) passive dip in solution for 5 min, 2) anodically polarized at 50 mA/$cm^2$ for 5 min, and 3) anodically polarized at 100 mA/$cm^2$ for 5 min. Following etching the samples were neutralized, as appropriate and then rinsed in deionized water and the resulting mass loss from etching was documented.

The etch compositions, etching conditions, mass loss during etching and adhesion strength after etching are shown in the Tables 4-7 below. In this experiment only the permanganate etch under all conditions tested and the sulfuric acid control etch were found to result in a weight loss. The slight increase in mass in the other samples may be a result of "swelling" (absorption of liquid) during etching which is known to occur with various polymer substrates including fiber reinforced epoxy composites.

In all etch solutions investigated a significant increase in adhesion strength is obtained (>30%) by applying an anodic current assist during etching without any increase in etching time. The adhesion strength was found to increase with increased anodic assisted etch current density (100 mA/$cm^2$ compared to 50 mA/$cm^2$). The oxidizing etch solutions (permanganate and chromic) were found to provide the highest adhesion values.

All samples were also exposed to 10 cycles according to ANSI/ASTM specification B604-75 section 5.4, service condition 4 and all samples, except for the sulfuric acid etch and NaOH etch for dipping only, passed the test.

TABLE 4

| Permanganate Etch | |
| --- | --- |
| Solution Type | Chemical Composition |
| MacDermid Permanganate Etch 5 min @ 45° C. | M-Permanganate: 60 g/L M-79224: 60 g/L D.I. Water: 940 g/L |

TABLE 4-continued

| Permanganate Etch | | |
| --- | --- | --- |
| Etching Type | Adhesion (ASTM D4541-02 Method E) [psi] | Thermal Cycling Test (ANSI/ASTM B604-75 section 5.4); Service Condition 4, 10 Cycles/Displacement $\Delta L/L$ [%] |
| Dip only | 433 | Pass/~0 |
| Dip & Anodic Etch @ 50 mA/$cm^2$ | 668 | Pass/~0 |
| Dip & Anodic Etch @ 100 mA/$cm^2$ | 1069 | Pass/~0 |

TABLE 5

| Sulfuric Acid Etch | |
| --- | --- |
| Solution Type | Chemical Composition |
| Sulfuric Acid Etch 5 min @ 25° C. | $H_2SO_4$: 5% (in D.I. water) |

| Etching Type | Adhesion (ASTM D4541-02 Method E) [psi] | Thermal Cycling Test (ANSI/ASTM B604-75 section 5.4); Service Condition 4, 10 Cycles/Displacement $\Delta L/L$ [%] |
| --- | --- | --- |
| Dip only | 169 | Failure/delamination |
| Dip & Anodic Etch @ 50 mA/$cm^2$ | 227 | Pass/~0 |
| Dip & Anodic Etch @ 100 mA/$cm^2$ | 328 | Pass/~0 |

TABLE 6

| Sodium Hydroxide Etch | |
| --- | --- |
| Solution Type | Chemical Composition |
| Sodium Hydroxide Etch 5 min @ 25° C. | NaOH: 25% (in D.I. water) |

| Etching Type | Adhesion (ASTM D4541-02 Method E) [psi] | Thermal Cycling Test (ANSI/ASTM B604-75 section 5.4); Service Condition 4, 10 Cycles/Displacement $\Delta L/L$ [%] |
| --- | --- | --- |
| Dip only | 185 | Failure/delamination |
| Dip & Anodic Etch @ 50 mA/$cm^2$ | 409 | Pass/~0 |
| Dip & Anodic Etch @ 100 mA/$cm^2$ | 643 | Pass/~0 |

TABLE 7

Chromic Acid Etch

| Solution Type | Chemical Composition |
|---|---|
| Chromic Acid Etch 5 min @ 50° C. | Chromic acid: 5% |
| | Phosphoric acid: 15% |
| | Sulfuric acid: 55% (in D.I. water) |

| Etching Type | Adhesion (ASTM D4541-02 Method E) [psi] | Thermal Cycling Test (ANSI/ASTM B604-75 section 5.4); Service Condition 4, 10 Cycles/Displacement ⊿L/L [%] |
|---|---|---|
| Dip only | 408 | Pass/~0 |
| Dip & Anodic Etch @ 50 mA/cm² | 772 | Pass/~0 |
| Dip & Anodic Etch @ 100 mA/cm² | 893 | Pass/~0 | metallic layer thickness of ~100 micron. Substrate materials included graphite/epoxy sourced from Newport Adhesives and Composites, Irvine, Calif., USA and glass fiber/polyamide composite coupons sourced from BASF, Florham Park, N.J., USA. After appropriate chemical activation (chromic acid etch according to Table 7, dip only) all samples subjected to electroplating were metalized using a commercial silvering solution (available from Peacock Laboratories Inc., of Philadelphia, Pa., USA; average grain size 28 nm). Microscope analysis revealed anchoring structures that included cross-hatched grooves, cavities, pitted anchoring structures and protruding anchoring fibers and, depending on the sample, their population amounted to between about 3,000 and about 10,000 per cm. Subsequently, fine-grained Ni-based metallic layers were deposited from a modified Watts bath as described in US 2005/0205425 A1, published Sep. 22, 2005. Amorphous Ni-based layers (~20 micron thick Ni-7P) were deposited directly onto the etched polymeric substrates using an electroless nickel bath available from MacDermid Inc., Waterbury, Conn., USA.

Table 8 summarizes the mechanical properties of the metal clad polymer articles.

TABLE 8

Mechanical Properties of the metal clad polymer articles.

| Substrate (2 mm thick) | Coating Chemistry (20 micron thick) | Yield Strength [MPa] | Ultimate Tensile Strength [MPa] | Young's Modulus [GPa] | Elastic Limit [%] |
|---|---|---|---|---|---|
| Glass Fiber/Polyamide Composite | Ni—7P (amorphous) Without Ag metalizing layer | 146 | 146 | 6.6 | 2.2 |
| Glass Fiber/Polyamide Composite | Ni (15 nm) With Ag metalizing layer | 148 | 152 | 7.4 | 2.0 |
| Glass Fiber/Polyamide Composite | 50Ni—50Fe (20 nm) With Ag metalizing layer | 150 | 154 | 7.0 | 2.1 |
| Graphite Fiber/Epoxy Composite | Ni—7P (amorphous) Without Ag metalizing layer | 601 | 601 | 70 | 0.9 |
| Graphite Fiber/Epoxy Composite | Ni (15 nm) With Ag metalizing layer | 603 | 608 | 71 | 0.9 |
| Graphite Fiber/Epoxy Composite | 50Ni—50Fe (20 nm) With Ag metalizing layer | 605 | 610 | 70 | 0.9 |

Working Example IV

Graphite or Glass-Filled Polymeric Composites Activated by Acid Etching and Coated with an Amorphous Ni-Based Metallic Layer or Coated with an Intermediate Conductive Layer and a Fine-Grained Ni Layer 5 cm by 5 cm coupons (thickness 2 mm) of various substrates were suitable pretreated using a chromic acid etch solution as per Working Example III Table 7 and coated with various fine-grained materials available from Integran Technologies Inc. (www.integran.com; Toronto, Canada) to a The coated samples were exposed to the thermal cycling test described above. The adhesion strength was measured using ASTM D4541-02 Method E using the "PosiTest AT Adhesion Tester" available from the DeFelsko Corporation of Ogdensburg, N.Y., USA. In all cases debonding occurred between the polymer material surface and the immediately adjacent metal layer. The data displayed in Table 9 indicate that acceptable thermal cycling performance is achieved. All samples were also exposed to 10 cycles according to ANSI/ASTM specification B604-75 section 5.4, service condition 4 without failure.

TABLE 9

Thermal Cycling/Adhesion Test Results

| Substrate Chemistry | Min/Max Substrate CLTE [$10^{-6}$ K$^{-1}$] | Coating Chemistry (Average grain size in nm) | Coating CLTE [$10^{-6}$ K$^{-1}$] | Thermal Cycling Test (−196 to 90° C.) Performance after 10 cycles/ Displacement $\Delta L/L$ [%] | Pull-Off Strength ASTM D4541-02 Method E [psi] |
|---|---|---|---|---|---|
| Glass Fiber/Polyamide Composite | 20/110 | Ni—7P (amorphous) Without Ag metalizing layer | 20 | Pass/~0 | 300 |
| Glass Fiber/Polyamide Composite | 20/110 | Ni (15 nm) With Ag metalizing layer | 13 | Pass/~0 | 300 |
| Glass Fiber/Polyamide Composite | 20/110 | 50Ni—50Fe (20 nm) With Ag metalizing layer | 10 | Pass/~0 | 300 |
| Graphite Fiber/Epoxy Composite | 5/55 | Ni—7P (amorphous) Without Ag metalizing layer | 20 | Pass/~0 | 620 |
| Graphite Fiber/Epoxy Composite | 5/55 | Ni (15 nm) With Ag metalizing layer | 13 | Pass/~0 | 620 |
| Graphite Fiber/Epoxy Composite | 5/55 | 50Ni—50Fe (20 nm) With Ag metalizing layer | 10 | Pass/~0 | 620 |

Working Example V

Coating of Fully-Cured and Partially-Cured Graphite Reinforced Polymer Composites with a Silver (Ag) Intermediate Layer and a Fine-Grained Ni Layer, Including Heat-Treatment of the Partially-Cured Coated Part Three 15×15 cm samples of 6 mm thick conductive carbon-fiber reinforced plastic (CFRP) sheet (CLTE: in the plane 3×10$^{-6}$ K$^{-1}$ and CLTE: 60×10$^{-6}$ K$^{-1}$ normal to the plane) were obtained from Janicki Industries of Sedro-Wooley, Wash., USA. Two of the panels were only "partially" cured, while the third panel was "fully" cured. The coupons were ground on one side with 80 grit SiC paper to a consistent surface roughness, cleaned with Alconox, (a surfactant available from Alconox Inc. obtainable from Olympic Trading Co. of St. Louis, Mo., USA) and steel wool, followed by ultrasonically cleaning in deionized water for 5 minutes. The samples was then rinsed in isopropanol, dried and degreased with 1,2-dichloroethane to remove any residual oils and/or films.

The CFRP panels were then chemically etched in a standard acid sulfa-chromic etch solution consisting of 300 g/L chromic acid and 250 g/l sulfuric acid in deionized water. After surface preparation the surface roughness of the coupons was determined to be Ra ~2.0 micron and Ry$_{max}$ ~10.0 micron. Microscope analysis revealed that the anchoring structures included cavities and pitted anchoring structures and their population ranged from about 1,000 to about 25,000 per cm. Following etching, the samples were rinsed in deionized water and submerged in neutralizer solution consisting of 5 g/l of sodium metabisulfite for 5 minutes at room temperature. After neutralizing, the samples were rinsed with deionized water and metalized using a commercial silvering solution (available from Peacock Laboratories Inc., of Philadelphia, Pa., USA; average grain size 28 nm) and coated with 50 μm of fine-grained Ni (average grain size ~15 nm, CLTE: ~13×10$^{-6}$ K$^{-1}$) according to the process of US 2005/0205425 A1, published Sep. 22, 2005.

The metal clad articles had a yield strength of 602 MPa, an ultimate tensile strength of 606 MPa, a Young's modulus of 7.4 GPa and an elastic limit of 0.9%.

One of the panels was then subjected to a post-coating heat-treatment in a drying oven for an additional 2 hours at 177° C. to fully cure the partially cured panel. The pull-off adhesion strength of the coatings of the three CFRP samples was then measured following ASTM D4541-02 "Standard Test Method for Pull-Off Strength of Coatings Using Portable Adhesion Testers" using the "PosiTest AT Adhesion Tester" available from the DeFelsko Corporation of Ogdensburg, N.Y., USA.

The pull-off adhesion strength for the three samples is summarized in the Table 10. The pull-off strength for the "partially" cured sample was found to be significantly higher than that of the "fully" cured sample. The data also shows that a further increase in adhesion strength can be obtained by fully curing the "partially" cured CFRP panel after the metal coating. All samples were also exposed to 10 cycles according to ANSI/ASTM specification B604-75 section 5.4, service condition 4 without failure.

TABLE 10

Pull-Off Strength Data (ASTM D4541-02) for Samples.

| Sample Information | Pull-off Strength (ASTM D4541-02) [psi] | Thermal Cycling Test (ANSI/ASTM B604-75 section 5.4); Service Condition 4, 10 Cycles/Displacement $\Delta L/L$ [%] |
|---|---|---|
| Coating on fully cured CFRP-substrate | 490 | Pass/~0 |
| Coating on partially cured CFRP-substrate | 1542 | Pass/~0 |
| Coating on partially cured CFRP-substrate with post-plate heat treatment (2 hours at 177° C.) | 2078 | Pass/~0 |

Working Example VI

Glass-Filled Polymer Composites Activated by Acid Etching and Coated with an Amorphous Ni-Based Intermediate Conductive Layer and a Fine-Grained Ni Layer, Followed by Post Plate Heat-Treatment 5 cm by 5 cm coupons (thickness 2 mm) were cut from a commercially available 14% glass-filled polyamide substrate (Caspron®, BASF, Florham Park, N.J., USA). The CLTE of the coupon in the plane was $32 \times 10^{-6}$ K$^{-1}$ and normal to the plane $70 \times 10^{-6}$ K$^{-1}$. Samples were suitable pretreated using a chromic acid etch solution as per Working Example III Table 7 (dip only). After neutralizing, the samples were rinsed with deionized water and metalized using a commercial amorphous electroless Ni-7P coating available from MacDermid Inc. of Waterbury, Conn., USA and thereafter coated with 20 μm thick fine-grained nickel (average grain size ~20 nm, CTLE $13 \times 10^{-6}$ K$^{-1}$) according to the process of US 2005/0205425 A1, published Sep. 22, 2005, available from Integran Technologies Inc. (www.integran.com; Toronto, Canada).

The metal clad articles had a yield strength of 148 MPa, an ultimate tensile strength of 152 MPa, a Young's modulus of 7.4 GPa and an elastic limit of 2.0%.

Microscope analysis revealed that anchoring structures included cross-hatched grooves, cavities, pitted anchoring structures and protruding anchoring fibers and amounted to between about 10,000 and 15,000 per cm. Selected samples were heat treated at 80° C. and the adhesion and thermal cycling performance determined. The peel and pull-off adhesion strength of the samples was then measured following ASTM D4541-02 "Standard Test Method for Pull-Off Strength of Coatings Using Portable Adhesion Testers" and ASTM 8533-85(2004) "Standard Test Method for Peel Strength of Metal Electroplated Plastics" using an Instron 3365 testing machine equipped with the 90 degree peel test fixture, and a 5 KN load cell, available from Instron Corporation, Norwood, Mass., USA. In all cases debonding occurred between the polymer material surface and the immediately adjacent metal layer. The data displayed in Table 11 indicate that acceptable thermal cycling performance is achieved. All samples were also exposed to 10 cycles according to ANSI/ASTM specification B604-75 section 5.4, service condition 4 without failure. It is noted that post-plating heat-treatment modestly enhances the pull-off strength whereas the peel strength drastically deteriorates. As highlighted above and illustrated in Example 1 there is no correlation between pull-off and peel strength data.

TABLE 11

Thermal Cycling/Adhesion Test Results

| Min/Max Substrate CLTE [$10^{-6}$ K$^{-1}$] | Coating Chemistry (Average grain size in nm) | Coating CLTE [$10^{-6}$ K$^{-1}$] | Post Plating Heat-Treatment Duration at 80° C. [hrs] | Pull-Off Strength ASTM D4541-02 Method E [psi] | Peel Strength (ASTM B533-85) [N/cm] | Thermal Cycling Test (ANSI/ASTM B604-75 section 5.4); Service Condition 4, 10 Cycles/Displacement ΔL/L [%] |
|---|---|---|---|---|---|---|
| 32/70 | Ni (15 nm) With NiP metalizing layer | 13 | 0 | 862 | 9 | Pass/~0 |
| 32/70 | Ni (15 nm) With NiP metalizing layer | 13 | 1 | 932 | 7 | Pass/~0 |
| 32/70 | Ni (15 nm) With NiP metalizing layer | 13 | 2 | 885 | 5 | Pass/~0 |

Working Example VII

Fine-Grained Co—P Metal Layer with a Rough Surface Produced Electrochemically Prior to Applying a Polymer Based Backing Layer A metal-clad polymer part was fabricated from two components, namely a face plate comprised of a durable electroformed fine-grained Co-2P alloy (15 nm average grain size, CLTE in plane and normal to it: ~$15 \times 10^{-6}$ K$^{-1}$), and a polymer backing structure comprising a thermoplastic polymer (polypropylene, CLTE in plane and normal to it: ~$85 \times 10^{-6}$ K$^{-1}$). Rather than coating the activated polymer substrate with a fine-grained metal, the layers were applied in reverse order, namely the first step entailed plating the fine-grained Co-2P alloy layer (average grain size 15 nm) according to US 2005/0205425 A1, published Sep. 22, 2005, onto a polished temporary titanium substrate. After building up the fine-grained metallic layer to a thickness of approximately 250 microns, the applied current density was raised substantially to deposit a rough "bonding surface" with anchoring structures including protrusions and dendritic nodules with a porous substructure and, depending on the sample, their population count ranged between about 100 and about 3,000 per cm. After plating, the surface roughness of the metallic layer, to serve as interface with the polymeric layer, was determined to be Ra ~125 micron and Ry$_{max}$ ~250 micron. As outlined, the important feature of the design is to purposely create a rough surface on the backside of the faceplate which allows for excellent adhesion between the metal faceplate and the polymer backing structure. A polypropylene substrate backing was applied to the rough side of the fine-grained metal layer in a subsequent step by compression molding to an ultimate thickness of 6 mm. Metal-clad polymer samples exposed to 10 cycles according ANSI/ASTM specification B604-75 section 5.4, service condition 4, did not fail and the adhesion strength values that have been obtained using ASTM D4541-02 Method E all exceeded 300 psi. The metal clad articles had a yield strength of 96 MPa, an ultimate tensile strength of 113 MPa, a Young's modulus of 6.5 GPa and an elastic limit of 1.0%.

Working Example VIII

Molded Polypropylene Using Embossing Die Mold Inserts, Activated by Chemical Etching and Coated with an Amorphous Ni-Based Intermediate Conductive Layer Followed by Coating a Fine-Grained Cu Layer, a Fine-Grained Ni—Co—Fe Metal-Layer Molded cell phone casings (~5 cm by 10 cm, thickness 1 mm) were injection molded from a commercially available polypropylene (RTP-141H provided by the RTP Company, Winona, Minn. 55987, USA). The CLTE in all directions was about $65-80 \times 10^{-6}$ $K^{-1}$. Before use, the injection mold cavity was ground back and suitably lined with 500 micron thick, fine-grained Ni embossing die inserts. The embossing die inserts were electroplated as described in US 2005/0205425 A1, published Sep. 22, 2005, available from Integran Technologies Inc. (www.integran.com; Toronto, Canada). The molding surfaces of the fine-grained Ni inserts were shot-peened (180 grit $Al_2O_3$ at 87 psi at a distance of 10 cm) and chemically etched in 5% $HNO_3$ (30 minutes at room temperature) as described in copending application by Victor, entitled "Metallic articles With Hydrophobic Surfaces" (Integran 6236), to create the desired embossing die surface features for embossing the anchoring structures into the molded polymer housings. The embossing inserts imprinted the anchoring structures on the entire inner and outer surfaces of the cell phone housings. After forming, selected molded cell phone cases were also suitable pretreated on the surface to be plated using a chromic acid etch solution as per Working Example III Table 7 (sulfochromic etch, dip only). The outside casings and all other areas not to be plated were masked off and not etched. After neutralizing, the samples were rinsed with deionized water and metalized using a commercial amorphous electroless Ni-7P coating available from MacDermid Inc. of Waterbury, Conn., USA and thereafter coated with 12.5 µm thick fine-grained Cu (average grain size 4 micron, CTLE $17 \times 10^{-6}$ $K^{-1}$) according to the electrodeposition process of WO 2009/076,777 published Jun. 25, 2009, available from Integran Technologies Inc. (www.integran.com; Toronto, Canada), followed by 75 µm of fine-grained 40Ni-40Co-20Fe (average grain size ~20 nm, CTLE $13 \times 10^{-6}$ $K^{-1}$) according to the process of US 2005/0205425 A1, published Sep. 22, 2005, available from Integran Technologies Inc. (www.integran.com; Toronto, Canada). As a result of the embossed polymer surface the metal coating had a satin surface finish. The texturing greatly reduced the risk of slipping and dropping the part and rendered it comfortable to firmly grip and hold.

Microscope analysis revealed that anchoring structures included micro- and nanostructured protrusions amounting to between about 10,000 and 15,000 per cm. The pull-off strength of the samples was then measured following ASTM D4541-02 "Standard Test Method for Pull-Off Strength of Coatings Using Portable Adhesion Testers". In all cases debonding occurred between the polymer material surface and the immediately adjacent metal layer. The data displayed in Table 12 indicate that acceptable thermal cycling performance is achieved. All samples were also exposed to 10 cycles according to ANSI/ASTM specification B604-75 section 5.4, service condition 4 without failure.

TABLE 12

Cell Phone Housing Properties, Adhesion and Thermal Cycling Results.

| Min/Max CLTE [$10^{-6}$ $K^{-1}$] | Coating Chemistry (Average grain size in nm) | Coating CLTE [$10^{-6}$ $K^{-1}$] | Coating thickness [µm] | Pull-Off Strength ASTM D4541-02 Method E [psi] | Thermal Cycling Test (ANSI/ASTM B604-75 section 5.4); Service Condition 4, 10 Cycles; Displacement $\Delta L/L$ [%] |
|---|---|---|---|---|---|
| 13/80 | Polypropylene | 65-80 | N/A-Embossed Substrate | 1,550 | Pass/~0 |
|  | Ni—8P (amorphous) | 13 | <1 |  |  |
|  | Cu (4,000 nm) | 17 | 12.5 |  |  |
|  | 40Ni—40Co—20Fe (20 nm) | 13 | 75 |  |  |

When applying the metallic layer on the outside of the housing a thin layer of conventional hard chromium (<1 µm) was electroplated for decorative purposes. Selected samples employed a second Cu layer (25 µm) after the application of the NiCoFe layer to enhance thermal conductivity and heat dissipation when used in the device. The Ni—Fe—Co layer provides for EMI and RFI shielding. Alternative electroplated EMI or RFI shielding layers included Ni, Co and Fe or any of their alloys including Ni-20Fe and Ni-50Fe. Selected samples were also plated with 10 micron thick Sn layer for corrosion protection and selected samples did not contain a Cr flash.

It was surprisingly noticed that the uncoated outside layer of the polymer casings imprinted with the embossed anchoring structures exhibited a significant increase in the contact angle for water, i.e., the polymer surface became more water repellent, at times superhydrophobic and self cleaning as highlighted in Table 13. The contact angle was measured by placing multiple 5 µl droplets of deionized water on a flat sample surface and taking a picture with a stereoscope at 15× magnification. Contact angle measurements were taken from the digitally captured images using Image-pro software. Only a very modest increase in the contact angle is noticed when the "as molded" smooth polymer surface is etched) (3°-6°, however, a substantial contact angle increase is noted after embossing the unetched polymer surface with various embossing dies (31°-60° contact angle increase).

TABLE 13

Contact angle of unplated and plated PP surfaces with and without embossing with anchoring structures.

| Sample Information | Contact Angle of PP before and after embossing with various Nanometal dies [degrees] |
|---|---|
| Smooth Molded PP Surface | 97 |
| Plated Smooth Molded PP Surface | 69 |
| Imprinted Molded PP Surface | 151 |
| Plated Imprinted Surface | 64 |

Working Example IX

Molded Polyamide Using Embossing Die Mold Inserts, Activated by Chemical Etching and Coated with an Amorphous Cu-Based Intermediate Conductive Layer Followed by Coating with Various Fine-Grained Layers Polymer cell phone casings (~5 cm by 10 cm, thickness 1 mm) were injection molded and imprinted as described in Example VIII using a polyamide polymer (Durethan BKV130, supplied by Lanxess Corp., Pittsburgh, Pa., USA). The cell phone casings were etched using PM 847, a semi-aqueous acid etchant containing glycol provided by Rohm and Haas Electronic Materials (Freeport, N.Y., USA) and metalized using a commercial amorphous electroless Cu coating (M-Copper 15) available from MacDermid Inc. of Waterbury, Conn., USA. The polymer casings were totally encapsulated with the applied coatings. Coating thickness, compositions, pull-off and thermal cycling performance data are provided in Table 14. Microscope analysis revealed that anchoring structures included micro- and nanostructured protrusions amounting to between about 10,000 and 15,000 per cm.

For comparison purposes cell phone casings were molded using a "smooth mold" without the imprinted surface, otherwise processed as indicated for sample 1 and tested. The average pull-off strength was determined to be 485±17 psi and the thermal cycling test was passed without delamination and with 0% displacement. Peel strength was determined as well for all samples using ASTM B533-85(2004) "Standard Test Method for Peel Strength of Metal Electroplated Plastics" using an Instron 3365 testing machine equipped with the 90 degree peel test fixture, and a 5 KN load cell, available from Instron Corporation, Norwood, Mass., USA, and no correlation between peel and pull-off data was noticed. The peel strength for embossed samples could not even be determined as the metal coating failed (ripped) before the coating separated from the polymer.

TABLE 14

Cell Phone Housing Design Variations; Adhesion & Cycling Test Results for Imprinted Polymer Substrates

| | Min/Max CLTE [$10^{-6}$ K$^{-1}$] | Coating Chemistry (Average grain size in nm) | Purpose | Coating CLTE [$10^{-6}$ K$^{-1}$] | Coating thickness [µm] | Pull-Off Strength ASTM D4541-02 Method E [psi] | Thermal Cycling Test (ANSI/ASTM B604-75 section 5.4); Service Condition 4, 10 Cycles/Displacement ΔL/L [%] |
|---|---|---|---|---|---|---|---|
| Sample 1 | 13/100 | Polyamide | Flat Substrate | 20-100 | N/A | 485 | Pass/~0 |
| | | Cu- (amorphous) | Metalizing Layer | 17 | <1 | | |
| | | Cu (4,000 nm) | Electrical conductivity and heat dissipation | 17 | 12.5 | | |
| | | Ni—20Fe (20 nm) | EMI & RFI shielding | 13 | 25 | | |
| | | Cu (400 nm) | Heat dissipation and antimicrobial properties | 17 | 10 | | |
| Sample 2 | 6/100 | Polyamide | Embossed Substrate | 20-100 | N/A | 700 | Pass/~0 |
| | | Cu (amorphous) | Metalizing Layer | 17 | <1 | | |
| | | Cu (4,000 nm) | Electrical conductivity and heat dissipation | 17 | 12.5 | | |
| | | Ni—20Fe (20 nm) | EMI & RFI shielding | 13 | 25 | | |
| | | Cr | Decorative | 6 | <1 | | |
| Sample 3 | 13/100 | Polyamide | Embossed Substrate | 20-100 | N/A | 700 | Pass/~0 |
| | | Cu (amorphous) | Metalizing Layer | 17 | <1 | | |
| | | Cu (4,000 nm) | Electrical conductivity and heat dissipation | 17 | 12.5 | | |
| | | Ni—20Fe (20 nm) | EMI & RFI shielding | 13 | 25 | | |
| | | paint | Decorative and superhydrophobic/self-cleaning | 100 | 5 | | |
| Sample 4 | 13/100 | Polyamide | Embossed Substrate | 20-100 | N/A | 700 | Pass/~0 |
| | | Cu (amorphous) | Metalizing Layer | 17 | <1 | | |
| | | Cu (4,000 nm) | Electrical conductivity and heat dissipation | 17 | 12.5 | | |
| | | Ni—20Fe (20 nm) | EMI & RFI shielding | 13 | 25 | | |
| | | Cu (400 µm) PTFE MMC | Heat dissipation, antimicrobial properties and superhydrophobic/self- | 20 | 10 | | |

TABLE 14-continued

Cell Phone Housing Design Variations; Adhesion & Cycling Test Results for Imprinted Polymer Substrates

| Min/Max CLTE [$10^{-6}$ K$^{-1}$] | Coating Chemistry (Average grain size in nm) | Purpose | Coating CLTE [$10^{-6}$ K$^{-1}$] | Coating thickness [μm] | Pull-Off Strength ASTM D4541-02 Method E [psi] | Thermal Cycling Test (ANSI/ASTM B604-75 section 5.4); Service Condition 4, 10 Cycles/Displacement ΔL/L [%] |
|---|---|---|---|---|---|---|
| | | cleaning | | | | |

Working Example X

Various Molded Polymers with and without Embossing by Compression Molding, Activated by Chemical Etching and Coated with an Amorphous Ni-Based Intermediate Conductive Layer Followed by Coating with Fine-Grained Ni A number of polymer golf club head face-plates were injection molded (3 cm by 8 cm, thickness 1 mm) using a polished mold surface. Plates were molded from two polymers: (i) glass filled polyamide polymer (urethan BKV130, supplied by Lanxess Corp., Pittsburgh, Pa., USA) and (ii) polypropylene (RTP-141H provided by the RTP Company, Winona, Minn. 55987, USA). Only one side of the surface of each face plate was embossed with an embossing die insert made as described in Example VIII. Embossing took place at 200° C. using compression molding. In addition, a set of faceplates was heat treated at 200° C. without any embossing to evaluate the effect of the applied post heat-treatment of the molded polymer sample on adhesion. Thereafter, all polyamide face plates were etched as illustrated in Example IX (glycol etch), polypropylene face plates were etched as in Example VIII (sulfochromic etch, dip only). After etching all samples were metalized and totally encapsulated with the applied coatings. Coating thickness, composition and CTLE values are provided in Table 15. Adhesion and thermal cycling performance were measured on the embossed surface, where applicable, as well as the flat back-surface by performing pull-off and peel tests, as described. These data are also displayed in Table 16. Microscope analysis of the embossed surfaces revealed that anchoring structures included micro- and nanostructured protrusions amounting to between about 10,000 and 15,000 per cm.

TABLE 15

Faceplate Design Information

| Min/Max CLTE [$10^{-6}$ K$^{-1}$] | Substrate/Coating Chemistry (Average grain size in nm) | Purpose | Coating CLTE [$10^{-6}$ K$^{-1}$] | Thickness [μm] |
|---|---|---|---|---|
| 13/100 | Polyamide (filled) | Substrate | 20-100 | 1,000 |
| | Ni-8P (amorphous) | Metalizing layer | 17 | <1 |
| | Ni (25 nm) | Strength and wear resistance | 13 | 20 |
| 13/80 | Polypropylene (filled) | Substrate | 65-80 | 1,000 |
| | Ni-8P (amorphous) | Metalizing layer | 17 | <1 |
| | Ni (25 nm) | Strength and wear resistance | 13 | 20 |

TABLE 16

Adhesion and Temperature Cycling Test Results for Flat and Embossed Polymer Substrates

| Sample | Polymer Surface Treatment | Metal-Clad Polymer Heat Treatment at 200° C. | Pull-Off Strength ASTM D4541-02 Method E [psi] | Thermal Cycling Test (ANSI/ASTM B604-75 section 5.4); Service Condition 4, 10 Cycles/Displacement ΔL/L [%] |
|---|---|---|---|---|
| Polyamide | N/A-flat surface | N/A | 596 ± 16 | Pass/~0 |
| Polyamide | N/A-flat surface | Yes | 362 ± 6 | Pass/~0 |
| Polyamide | Embossed | Yes | 699 ± 10 | Pass/~0 |
| Polypropylene | N/A-flat surface | N/A | 1,018 ± 33 | Pass/~0 |
| Polypropylene | N/A-flat surface | Yes | 1,167 ± 250 | Pass/~0 |
| Polypropylene | Embossed | Yes | 1,535 ± 185 | Pass/~0 |

The peel strength was measured as well and ranged from as low as 2.5N/cm to an upper limit which could not be determined as the metal coating failed (ripped) before the coating separated from the polymer. No correlation between pull-off and peel adhesion values was observed. The data reveal a significant increase in adhesion strength for samples which, before exposure to chemical etching, were imprinted. It is also noticeable, that heat-treatment (HT) of the plated not-imprinted polyamide samples significantly reduced the adhesion, while, in the case of not-imprinted polypropylene, the heat-treatment did not significantly alter adhesion.

VARIATIONS

The foregoing description of the invention has been presented describing certain operable and preferred embodiments. It is not intended that the invention should be so limited since variations and modifications thereof will be obvious to those skilled in the art, all of which are within the spirit and scope of the invention.

What is claimed is:

1. A metal-clad polymer article comprising:
   (i) a polymeric material which at room temperature has a coefficient of linear thermal expansion in the range between $30 \times 10^{-6}$ K$^{-1}$ and $250 \times 10^{-6}$ K$^{-1}$ in at least one direction; and
   (ii) a metallic material having a microstructure which is fine-grained with an average grain size between 2 and 5,000 nm and/or an amorphous microstructure, the metallic material being in the form of a metallic layer having a thickness between 10 microns and 2.5 cm and a coefficient of linear thermal expansion at room temperature in all directions in the range between $-5.0 \times 10^{-6}$ K$^{-1}$ and $25 \times 10^{-6}$ K$^{-1}$;
   (iii) with or without at least one intermediate layer between the polymeric material and the metallic material;
   (iv) an interface between the polymeric material and the metallic material or an interface between the polymeric material and one of any intermediate layer if present and an interface between one of any intermediate layer if present and the metallic material;
   (v) anchoring structure at said interface(s) comprising recesses and/or protrusions to increase the interface area and provide enhanced physical bond at the interface between the polymeric material and the metallic material or at the interface between the polymeric material and one of any intermediate layer if present and at the interface between one of any intermediate layer if present and the metallic material;
   (vi) said metal-clad polymer article exhibiting no delamination after said article has been exposed to at least one temperature cycle according to ASTM B553-71 service condition 1, 2, 3 or 4; and
   (vii) said metal-clad polymer article exhibiting a pull-off strength between the polymeric material and the metallic material or a pull-off strength between one of any intermediate layer if present and the metallic material exceeding 200 psi as determined by ASTM D4541-02 Method A-E; and
   (viii) said metal-clad polymer article or portions thereof having a yield strength and/or ultimate tensile strength of between 10 and 7,500 MPa and an elastic limit between 0.5 and 30%.

2. The article according to claim 1 wherein the surface roughness of the polymeric material layer and/or the metallic material layer at any of said interfaces is in the range of Ra=0.01 micron and Ra=500 micron and/or Ry=0.02 micron and Ry=5,000 micron and/or Ry$_{max}$=0.02 micron and Ry$_{max}$=5,000 micron and/or Rz=0.02 micron and Rz=5,000 micron.

3. The article according to claim 2, wherein the metallic material contains particulate addition and said particulate addition is at least one material selected from the group consisting of a metal selected from the group consisting of Ag, Al, Cu, In, Mg, Si, Sn, Pt, Ti, V, W, and Zn; a metal oxide selected from the group consisting of Ag$_2$O, Al$_2$O$_3$, SiO$_2$, SnO$_2$, TiO$_2$, and ZnO; a carbide of B, Cr, Bi, Si, and W; carbon based material selected from the group consisting of carbon nanotubes, diamond, graphite, and graphite fibers; a ceramic; a glass; and a polymeric material selected from the group consisting of PTFE, PVC, PE, PP, ABS, and epoxy resin.

4. The article according to claim 1 wherein said metallic material is selected from the group consisting of:
   (i) one or more metals selected from the group consisting of Ag, Al, Au, Co, Cr, Cu, Fe, Ni, Mo, Pd, Pt, Rh, Ru, Sn, Ti, W, Zn and Zr,
   (ii) pure metals selected from the metals listed in (i) or alloys containing at least two of the metals listed in (i), further containing at least one element selected from the group consisting of B, C, H, O, P and S; and
   (iii) any of (i) or (ii) where said metallic coating also contains particulate additions in the volume fraction between 0 and 95% by volume.

5. The article according to claim 1, wherein said polymeric material comprises a polymeric material selected from the group consisting of epoxy resins, phenolic resins, urea resins, melamine resins, thermoplastic polymers, polyolefins, polyethylenes, polypropylenes, polyamides, poly-ether-ether-ketones, mineral filled polyamide resin composites, polyphthalamide, polyphthalates, polystyrene, polysulfone, polyimides, neoprenes, polyisoprenes, polybutadienes, polyisoprenes, polyurethanes, butadiene-styrene copolymers, chlorinated polymers, polyvinyl chloride, fluorinated polymers, polytetrafluoroethylene, polycarbonates, polyesters, and liquid crystal polymers.

6. The article according to claim 1 wherein the metallic layer metallic material represents between 5 and 95% of the total weight of the article.

7. The article according to claim 1, said article comprising at least one intermediate layer which is conductive between said metallic material and said polymeric material.

8. The article according to claim 7, wherein the at least one intermediate conductive layer comprises a metallic layer comprising Ag, Ni, Co or Cu or a combination thereof.

9. The article according to claim 7, wherein the at least one intermediate conductive layer comprises polymeric material with conductive particulates therein.

10. The article according to claim 9, wherein the at least one intermediate conductive layer is a conductive paint or a conductive epoxy.

11. The article according to claim 9, wherein the conductive particulates comprise Ag, Ni, Co or Cu or graphite or other conductive carbon or a combination thereof.

12. The article according to of claim 1, wherein said article is an automotive, aerospace, or sporting component.

13. The article according to claim 1, wherein said article is selected from the group consisting of:
   (i) cylindrical objects selected from the group consisting of gun barrels, shafts, tubes, pipes and rods for use as golf, arrow, skiing and hiking pole shafts, drive shafts, fishing poles, baseball bats, bicycle frames, ammunition casings, and wires and cables;
   (ii) medical equipment, orthopedic prosthesis, and surgical tools;

(iii) sporting equipment selected from the group consisting of golf shafts, heads and faceplates, lacrosse sticks, hockey sticks, skis and snowboards as well as their components, racquets for tennis, squash, and badminton, and bicycle parts;
(iv) components and housings for electronic equipment selected from the group consisting of laptops, cell phones, personal digital assistants (PDAs) devices, walkmen, discmen, digital audio players, e-mail functional telephones, cameras and other image recording devices, and televisions;
(v) automotive components selected from the group consisting of heat shields, cabin components, steering wheel and armature parts, fluid conduits, air ducts, fuel rails, turbocharger components, oil, fluid tanks and housings, cylinder head covers, spoilers, grill-guards and running boards, brake, transmission, clutch, steering and suspension parts, brackets and pedals, muffler components, wheels, vehicle frames, spoilers, fluid pumps, housing and tank components, and electrical and engine covers;
(vi) linings on hydraulic actuator, cylinders, drills, files, knives, saws, blades, sharpening devices and other cutting, polishing and grinding tools, housings, frames, hinges, sputtering targets, antennas, and electromagnetic interference (EMI) shields;
(vii) molds and molding tools and equipment;
(viii) aerospace parts selected from the group consisting of wings, wing flaps and access covers, structural spars and ribs, propellers, rotors, rotor blades, rudders, covers, housings, fuselage parts, nose cones, landing gears, lightweight cabin parts, cryogenic storage tanks, and ducts and interior panels; and
(ix) military products, ammunition, armor and firearm components.

14. The article according to claim 13 wherein said article comprises a polymeric substrate containing glass fibers and/or a carbon-containing material selected from the group consisting of graphite, graphite fibers, carbon, carbon fibers and carbon nanotubes.

15. The article according to claim 1, wherein said article has a tubular structure and said fine-grained metallic material extends over at least part of the inner or outer surface of said tubular structure.

16. The article according to claim 15, wherein said article is selected from the group consisting of gun barrels, drive shafts, arrow shafts, golf shafts, tubes, pipes, rods, fishing rods, cartridge casing, baseball/softball bats, hockey sticks, wires, cables, and fishing, skiing and hiking poles.

17. The article of claim 1, wherein the metallic layer has a thickness between 50 and 500 microns.

18. The article of claim 1, wherein said article contains at least one intermediate layer between the polymeric material and the metallic material which is electrically conductive or adhesive and which comprises a material selected from the group consisting of Cu, Ni, Co, Ag, and carbon; Cu, Ni, and/or Ag filled polymer; and organic adhesive.

19. The article of claim 1, wherein the anchoring structure is at least one structure selected from the group consisting of ink bottle shaped cavities, pitted anchoring structures, anchoring surfaces with protruding anchoring fibers, grooved, roughened and/or etched anchoring surface structures, and dimples or mounds configured to interlock adjacent layers, or combinations thereof.

20. The article of claim 1, wherein the anchoring structure has a population of recesses and/or protrusions to enhance the physical bond to the metallic layer in the range of 1 to 10,000,000 per mm$^2$ of interface(s) area, said recesses and/or protrusion having a height/depth range between 10 nm and 1 mm and a diameter ranging between 50 nm and 1 mm.

21. The article of claim 1, wherein displacement of said metallic material layer relative to the polymeric material or relative to one of any intermediate layer if present after at least one temperature cycle according to ASTM B553-71 service condition 1, 2 3 or 4 is less than 2%.

22. The article of claim 1, wherein said article has the coefficient of linear thermal expansion at room temperature in all directions of the metallic layer and the coefficient of linear thermal expansion at room temperature of one of any intermediate layer if present in all directions of at least 20% less than the coefficient of linear thermal expansion at room temperature in at least one direction of the polymeric material.

23. A method for preparing the metal-clad polymer article of claim 1 comprising:
(i) providing a polymeric material which at room temperature has a coefficient of linear thermal expansion between $30 \times 10^{-6}$ K$^{-1}$ to $250 \times 10^{-6}$ K$^{-1}$ in at least one direction,
(ii) providing a metallic material having a microstructure which is fine-grained with an average grain size between 2 and 5,000 nm and/or an amorphous microstructure where the metallic material is in the form of a metallic layer having a thickness between 10 microns and 2.5 cm and a coefficient of linear thermal expansion in all directions at room temperature in the range between $-5.0 \times 10^{-6}$ K$^{-1}$ and $25 \times 10^{-6}$ K$^{-1}$,
(iii) optionally providing at least one electrically conductive or electrically nonconductive adhesive intermediate layer,
(iv) providing at least one interface between the polymeric material and the metallic layer or at least one interface between the polymeric material and one of any intermediate layer if present and at least one interface between one of any intermediate layer if present and the metallic layer, and
(v) providing anchoring structure at said interface(s) to anchor polymeric material to metallic layer or polymeric material to one of any intermediate layer if present, and metallic layer to any intermediate layer or in the case of intermediate layers to anchor one intermediate layer if present to another.

24. The method of claim 23, wherein the coefficient of linear thermal expansion at room temperature in all directions of the metallic layer and of one of any intermediate layer if present being at least 20% less than the coefficient of linear thermal expansion in at least one direction of the polymeric material.

25. The method of claim 23 wherein at least one intermediate layer is deposited onto a polymeric substrate having anchoring structure associated therewith by a process selected from the group consisting of electroless deposition, physical vapor deposition (PVD), and chemical vapor deposition (CVD).

26. The method of claim 23 wherein the polymeric material is applied to the metallic layer having anchoring structure associated therewith.

* * * * *